Figure 1:
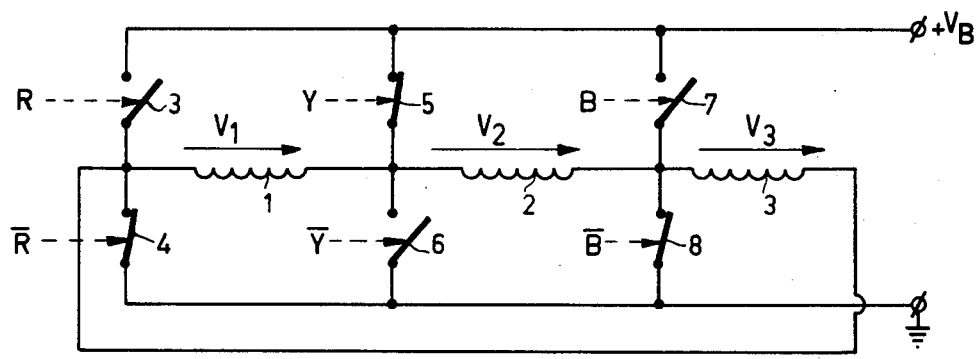

United States Patent [19]

van Loon et al.

[11] 4,189,669
[45] Feb. 19, 1980

[54] CIRCUIT ARRANGEMENT FOR GENERATING A PULSE-WIDTH MODULATED SIGNAL

[75] Inventors: Johannes C. F. van Loon; Engbert B. G. Nijhof, both of Eindhoven, Netherlands

[73] Assignee: U.S. Philips Corporation, New York, N.Y.

[21] Appl. No.: 787,091

[22] Filed: Apr. 13, 1977

[30] Foreign Application Priority Data

Apr. 20, 1976 [NL] Netherlands ............... 76604119

[51] Int. Cl.² ............................................ H02P 7/42
[52] U.S. Cl. .................................. 318/811; 318/341
[58] Field of Search ............... 318/341, 314, 318, 312, 318/807, 808, 809, 810, 811; 307/227; 328/14, 186; 363/43

[56] References Cited

U.S. PATENT DOCUMENTS

| | | | |
|---|---|---|---|
| 3,064,173 | 11/1962 | Breen et al. | 318/312 |
| 3,206,665 | 9/1965 | Burlingham | 318/312 |
| 3,646,417 | 2/1972 | Cassie et al. | 318/318 |
| 3,946,293 | 3/1976 | Feld | 318/314 |
| 3,950,682 | 4/1976 | Dohanich, Jr. | 318/314 |
| 4,117,364 | 9/1978 | Baker | 318/810 |

*Primary Examiner*—David Smith, Jr.
*Attorney, Agent, or Firm*—Thomas A. Briody; William J. Streeter; Bernard Franzblau

[57] ABSTRACT

A digital device for controlling a three-phase motor comprises a circuit arrangement for generating three pulse-width modulated carrier waves which are 120° phase-shifted relative to each other, whose modulation depth as a function of time represents a sinewave. A first clock signal periodically starts an up/down counter which counts the second clock signal. The carrier wave is generated by switching a flip-flop each time that the maximum count of the up/down counter is reached and the various modulation pulses which are required are generated symmetrically relative to this maximum count. A sequential network modulates the carrier wave sequentially with the correct modulation pulses.

21 Claims, 47 Drawing Figures

Fig. 9

|   | I | II | III |
|---|---|----|-----|
| 1 | 0 | 12 | 12 |
| 2 | 3 | 14 | 11 |
| 3 | 6 | 14 | 8 |
| 4 | 8 | 14 | 6 |
| 5 | 11 | 14 | 3 |

Fig. 10

|   | 1 | 2 | 3 | 4 | 5 | 6 |   |
|---|---|---|---|---|---|---|---|
| 1 | $C$ | $w_{12}+C$ | $w_{12}+C$ | $C$ | $\overline{w}_{12}\cdot C$ | $\overline{w}_{12}\cdot C$ | |
| 2 | $w_3+C$ | $w_{14}+C$ | $w_{11}+C$ | $\overline{w}_3\cdot C$ | $\overline{w}_{14}\cdot C$ | $\overline{w}_{11}\cdot C$ | |
| 3 | $w_6+C$ | $w_{14}+C$ | $w_8+C$ | $\overline{w}_6\cdot C$ | $\overline{w}_{14}\cdot C$ | $\overline{w}_8\cdot C$ | A |
| 4 | $w_8+C$ | $w_{14}+C$ | $w_6+C$ | $\overline{w}_8\cdot C$ | $\overline{w}_{14}\cdot C$ | $\overline{w}_6\cdot C$ | |
| 5 | $w_{11}+C$ | $w_{14}+C$ | $w_3+C$ | $\overline{w}_{11}\cdot C$ | $\overline{w}_{14}\cdot C$ | $\overline{w}_3\cdot C$ | |
| 1 | $\overline{w}_{12}\cdot C$ | $\overline{w}_{12}\cdot C$ | $C$ | $w_{12}+C$ | $w_{12}+C$ | $C$ | |
| 2 | $\overline{w}_{14}\cdot C$ | $\overline{w}_{11}\cdot C$ | $w_3+C$ | $w_{14}+C$ | $w_{11}+C$ | $\overline{w}_3\cdot C$ | |
| 3 | $\overline{w}_{14}\cdot C$ | $\overline{w}_8\cdot C$ | $w_6+C$ | $w_{14}+C$ | $w_8+C$ | $\overline{w}_6\cdot C$ | B |
| 4 | $\overline{w}_{14}\cdot C$ | $\overline{w}_6\cdot C$ | $w_8+C$ | $w_{14}+C$ | $w_6+C$ | $\overline{w}_8\cdot C$ | |
| 5 | $\overline{w}_{14}\cdot C$ | $\overline{w}_3\cdot C$ | $w_{11}+C$ | $w_{14}+C$ | $w_3+C$ | $\overline{w}_{11}\cdot C$ | |
| 1 | $w_{12}+C$ | $C$ | $\overline{w}_{12}\cdot C$ | $\overline{w}_{12}\cdot C$ | $C$ | $w_{12}+C$ | |
| 2 | $w_{11}+C$ | $\overline{w}_3\cdot C$ | $\overline{w}_{14}\cdot C$ | $\overline{w}_{11}\cdot C$ | $w_3+C$ | $w_{14}+C$ | |
| 3 | $w_8+C$ | $\overline{w}_6\cdot C$ | $\overline{w}_{14}\cdot C$ | $\overline{w}_8\cdot C$ | $w_6+C$ | $w_{14}+C$ | C |
| 4 | $w_6+C$ | $\overline{w}_8\cdot C$ | $\overline{w}_{14}\cdot C$ | $\overline{w}_6\cdot C$ | $w_8+C$ | $w_{14}+C$ | |
| 5 | $w_3+C$ | $\overline{w}_{11}\cdot C$ | $\overline{w}_{14}\cdot C$ | $\overline{w}_3\cdot C$ | $w_{11}+C$ | $w_{14}+C$ | |

| P | fo | fc | fc/fo |
|---|---|---|---|
| $P_1$ | 0.1 – 6.0 Hz | 17 – 1000 Hz | 168 |
| $P_2$ | 5.5 – 8.5 Hz | 660 – 1000 Hz | 120 |
| $P_3$ | 7.9 – 12.0 Hz | 660 – 1000 Hz | 84 |
| $P_4$ | 11.0 – 17.0 Hz | 660 – 1000 Hz | 60 |
| $P_5$ | 15.7 – 24.0 Hz | 660 – 1000 Hz | 42 |
| $P_6$ | 22.0 – 34.0 Hz | 660 – 1000 Hz | 30 |
| $P_7$ | 31.4 – 48.0 Hz | 660 – 1000 Hz | 21 |
| $P_8$ | 44.0 – ..... Hz | 660 – ..... Hz | 15 |

Fig. 11

| P | $f_1$ | $f_s$ | $f_c$ | $f_o$ | S |
|---|---|---|---|---|---|
| $P_1$ | $f_f/10$ | $f_1$ | $f_f/20$ | $f_f/3360$ | 1 |
| $P_2$ | $f_f/14$ | $f_1$ | $f_f/28$ | $f_f/3360$ | 1 |
| $P_3$ | $f_f/10$ | $f_1/2$ | $f_f/40$ | $f_f/3360$ | 2 |
| $P_4$ | $f_f/14$ | $f_1/2$ | $f_f/56$ | $f_f/3360$ | 2 |
| $P_5$ | $f_f/10$ | $f_1/4$ | $f_f/80$ | $f_f/3360$ | 4 |
| $P_6$ | $f_f/14$ | $f_1/4$ | $f_f/112$ | $f_f/3360$ | 4 |
| $P_7$ | $f_f/10$ | $f_1/8$ | $f_f/160$ | $f_f/3360$ | 8 |
| $P_8$ | $f_f/14$ | $f_1/8$ | $f_f/224$ | $f_f/3360$ | 8 |

Fig. 13

|   | I | II | III |
|---|---|----|-----|
| 1 | 0 | 9  | 9   |
| 2 | 2 | 9  | 8   |
| 3 | 3 | 10 | 7   |
| 4 | 4 | 10 | 6   |
| 5 | 6 | 10 | 4   |
| 6 | 7 | 10 | 3   |
| 7 | 8 | 9  | 2   |

| P | — | — |
|---|---|---|
| $P_1$ | 56 |    |
| $P_2$ | 40 | 64 |
| $P_3$ | 28 | 45 |
| $P_4$ | 20 | 33 |
| $P_5$ | 14 | 23 |
| $P_6$ | 10 | 17 |
| $P_7$ | 7  | 12 |
| $P_8$ |    | 9  |

| $X_1$ | $X_2$ | $X_3$ | $FC_7$ | $FC_8$ |
|---|---|---|---|---|
| 0 | 0 | 0 | $FI \cdot FH \cdot FG \cdot FC_3$ | $\overline{FI} \cdot FH \cdot FG \cdot FC_3$ |
| 1 | 0 | 0 | $FH \cdot FG \cdot FC_3$ | $\overline{FH} \cdot FG \cdot FC_3$ |
| 1 | 1 | 0 | $FG \cdot FC_3$ | $\overline{FG} \cdot FC_3$ |
| 1 | 1 | 1 | $FC_3$ | $\overline{FC_4}$ |

Fig.25

| $VC_5$ | $X_1$ | $X_2$ | $VC_2$ | $VC_3$ |
|---|---|---|---|---|
| 1 | 0 | 0 | $VA \cdot VC_1$ | $VA \cdot VB \cdot VC_1$ |
| 1 | 1 | 0 | $VC_1$ | $VB \cdot VC_1$ |
| 1 | 1 | 1 | $VC_1$ | $VC_1$ |
| 0 | 0 | 0 | $\overline{VA} \cdot VC_1$ | $\overline{VA} \cdot \overline{VB} \cdot VC_1$ |
| 0 | 1 | 0 | $VC_1$ | $\overline{VB} \cdot VC_1$ |
| 0 | 1 | 1 | $VC_1$ | $VC_1$ |

Fig.27a

| $VC_{20}$ | $VE \cdot VF \cdot VG$ |
|---|---|
| $VC_{21}$ | $VD \cdot VF \cdot VG + VC_{20}$ |
| $VC_{22}$ | $(X_4 \cdot VE + VF) \cdot VG$ |
| $VC_{23}$ | $(VE + X_4) \cdot VG + VC_{22}$ |
| $VC_{24}$ | $(VE + VD) \cdot VF + VG \cdot VD + VC_{23}$ |
| $VC_{25}$ | $VG$ |
| $VC_{26}$ | $(VD \cdot VE + X_4) \cdot VF + VG$ |
| $VC_{27}$ | $(VF + X_4) \cdot VE + VC_{26}$ |

Fig.31a

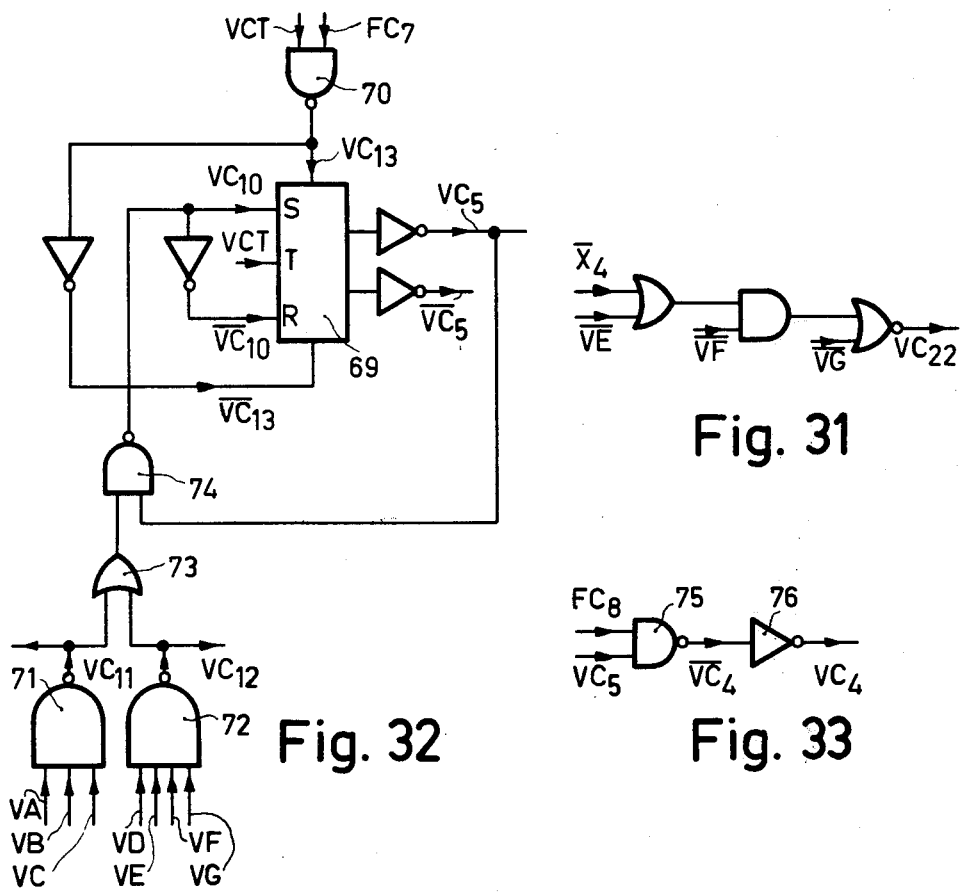
Fig. 31
Fig. 32
Fig. 33
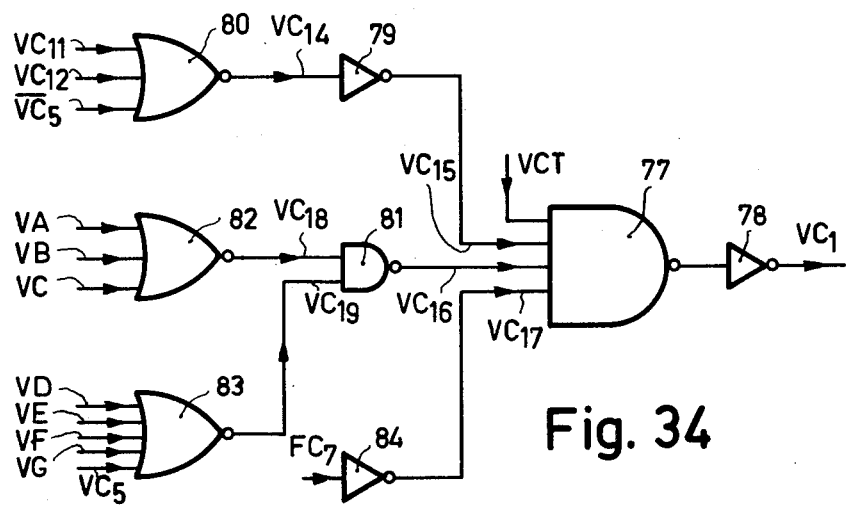
Fig. 34

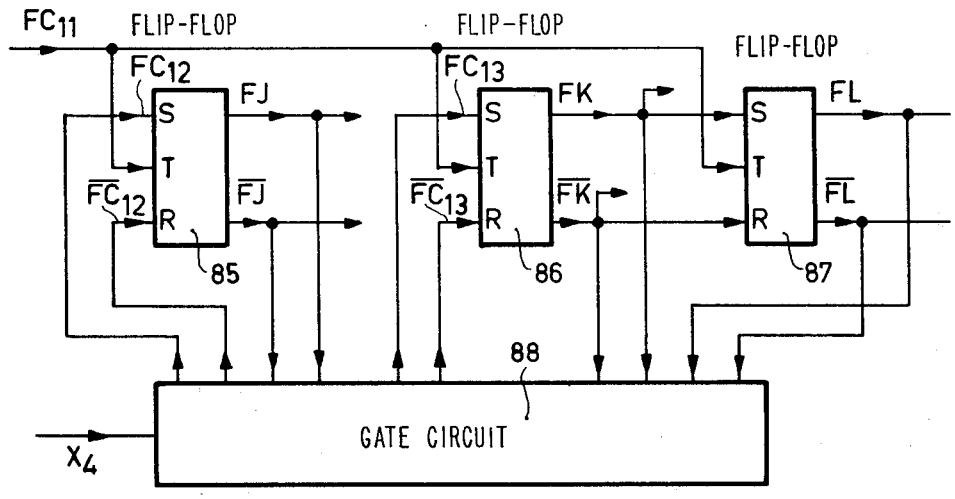
Fig. 35
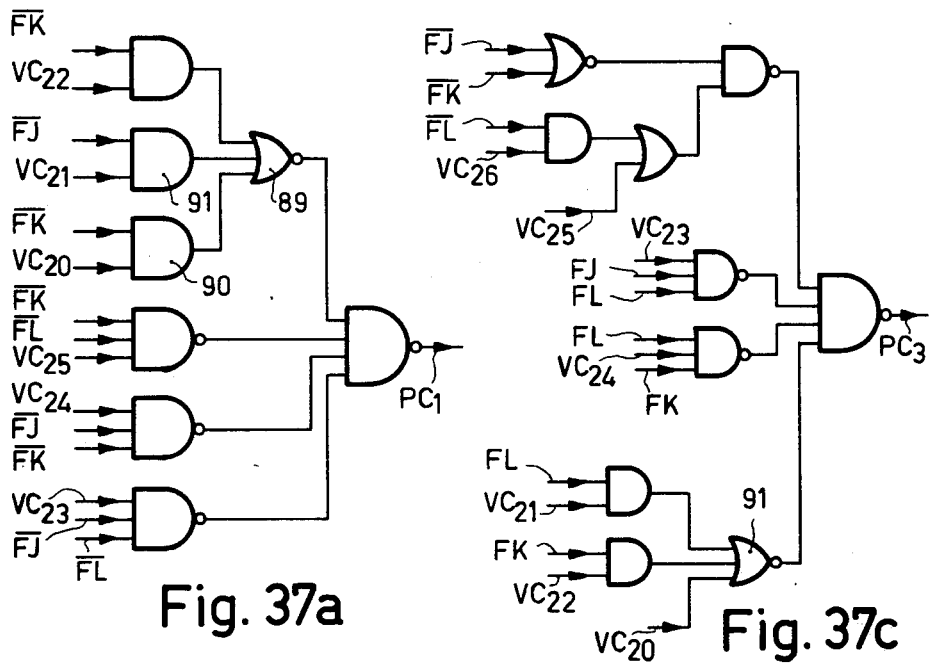
Fig. 37a
Fig. 37c
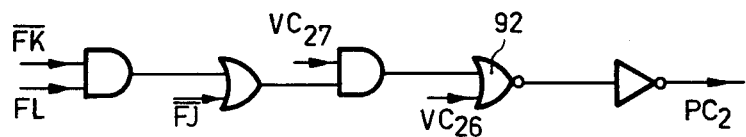
Fig. 37b

| $X_4$ | | FJ | FK | FL | $PC_1$ | $PC_2$ | $PC_3$ |
|---|---|---|---|---|---|---|---|
| 0 | 1 | 1 | 1 | 0 | 0 | $w_9$ | $w_9$ |
| | 2 | 1 | 1 | 1 | $w_2$ | $w_9$ | $w_8$ |
| | 3 | 0 | 1 | 1 | $w_3$ | $w_{10}$ | $w_7$ |
| | 4 | 1 | 0 | 1 | $w_4$ | $w_{10}$ | $w_6$ |
| | 5 | 0 | 1 | 0 | $w_6$ | $w_{10}$ | $w_4$ |
| | 6 | 0 | 0 | 1 | $w_7$ | $w_{10}$ | $w_3$ |
| | 7 | 1 | 0 | 0 | $w_8$ | $w_9$ | $w_2$ |
| 1 | 1 | 1 | 1 | 0 | 0 | $w_{12}$ | $w_{12}$ |
| | 2 | 0 | 1 | 1 | $w_3$ | $w_{14}$ | $w_{11}$ |
| | 3 | 1 | 0 | 1 | $w_6$ | $w_{14}$ | $w_8$ |
| | 4 | 0 | 1 | 0 | $w_8$ | $w_{14}$ | $w_6$ |
| | 5 | 0 | 0 | 1 | $w_{11}$ | $w_{14}$ | $w_3$ |

Fig. 36

| | PB | PC | PD | $PC_6$ | $PC_7$ | $PC_8$ | $PC_9$ | $PC_{10}$ | $PC_{11}$ | $PC_{13}$ | $PC_{14}$ | $PC_{15}$ |
|---|---|---|---|---|---|---|---|---|---|---|---|---|
| 1 | 1 | 0 | 0 | 0 | 0 | 1 | $\overline{PC_3}$ | $\overline{PC_2}$ | $\overline{PC_1}$ | $PC_3 + PE$ | $\overline{PC_2} \cdot PE$ | $PC_1 + PE$ |
| 2 | 1 | 1 | 0 | 0 | 1 | 0 | $\overline{PC_1}$ | $\overline{PC_3}$ | $\overline{PC_2}$ | $\overline{PC_1} \cdot PE$ | $\overline{PC_3} \cdot PE$ | $PC_2 + PE$ |
| 3 | 1 | 1 | 1 | 1 | 0 | 0 | $\overline{PC_2}$ | $\overline{PC_1}$ | $\overline{PC_3}$ | $\overline{PC_2} \cdot PE$ | $PC_1 + PE$ | $PC_3 + PE$ |
| 4 | 0 | 1 | 1 | 0 | 0 | 1 | $\overline{PC_3}$ | $\overline{PC_2}$ | $\overline{PC_1}$ | $\overline{PC_3} \cdot PE$ | $PC_2 + PE$ | $\overline{PC_1} \cdot PE$ |
| 5 | 0 | 0 | 1 | 0 | 1 | 0 | $\overline{PC_1}$ | $\overline{PC_3}$ | $\overline{PC_2}$ | $PC_1 + PE$ | $PC_3 + PE$ | $\overline{PC_2} \cdot PE$ |
| 6 | 0 | 0 | 0 | 1 | 0 | 0 | $\overline{PC_2}$ | $\overline{PC_1}$ | $\overline{PC_3}$ | $PC_2 + PE$ | $\overline{PC_1} \cdot PE$ | $\overline{PC_3} \cdot PE$ |

Fig. 39

CIRCUIT ARRANGEMENT FOR GENERATING A PULSE-WIDTH MODULATED SIGNAL

The invention relates to a circuit arrangement for generating a signal which consists of a pulse width modulated carrier wave whose modulation depth as a function of time represents a preselected signal waveform.

In this respect a pulse width modulated carrier wave is to be understood to mean a squarewave signal in which the position of the rising or the falling edge or both edges can vary in both directions relative to the unmodulated position.

Such a circuit arrangement can generate three signals which are 120° phase-shifted relative to each other and are characterized by a modulation depth which, as a function of time, represents a sinewave. Such a three-phase signal is employed to control three-phase motors which are energized from a direct voltage source via semiconductor switches. The frequency of the sinewaves, which represent the modulation depths as a function of time, then determines the motor speed and the average modulation depth determines the effective voltages across the motor phases.

Circuit arrangements of said type are known and are mainly based on a combination of analog and digital techniques. A known method of obtaining a pulse-width modulated signal is to compare a reference waveform with a high-frequency triangular or sawtooth signal. The difference signal is then converted into a pulse shaped signal.

Such a method is known from U.S. Pat. No. 3,753,155. According to said method a sawtooth generator is started a specific time before a reference instant, the generator output signal increasing from a level which is determined by an input signal.

The obtained pulse width is then determined by the time interval between the instant that the output voltage of the sawtooth generator reaches a specific level and the reference instant. Thus, the pulse width is always proportional to the amplitude of an input signal.

When a sinewave signal is chosen as an input signal, a pulse-width modulated signal is obtained whose modulation as a function of time is sinusoidal, the amplitude and the frequency of this sinewave being determined by said input signal. As a result of this, the accuracy of the output signal is determined by the accuracy of the input signal and it is necessary to generate an input signal, for example a sinewave, whose amplitude and frequency are determined by the desired output signal with minimal distortion. For example, for generating three such signals which are 120° phase shifted relative to each other, it is necessary to generate three sinewaves which are always 120° phase-shifted relative to each other at different frequencies and amplitudes. In addition, care must be taken that temperature and supply voltage variations and for example drift have substantially no influence on the analog section of the circuit arrangement which determines the pulse width.

It is an object of the invention to provide a circuit arrangement of the type mentioned in the preamble which can be of entirely digital design, wherein the desired modulation need not be applied to an input as an analog signal and both the frequency and the amplitude of the signal waveform which is contained in the modulation can be determined simply and, if desired, independently of each other.

For this the invention is characterized in that the circuit arrangement comprises a first counter, a first input for receiving a first clock signal with the aid of which the first counter is periodically started, a second input for receiving a second clock signal, the pulses of said second clock signal being counted by the first counter, and a sequential network for consecutively detecting preselected counts of the first counter, which sequential network generates the pulse-width modulated carrier wave, the pulse width being determined by the time interval between two counts of the first counter which are detected in different counting periods of the said counter, the sequence in which the various counts are detected being determined by said signal waveform.

In an arrangement in accordance with the invention the said signal waveform is defined by the sequential network so that said signal waveform no longer need be applied as an analog signal. As the first counter is started in synchronism with a first clock signal, the repetition frequency of the modulated pulses is synchronous with said clock signal and so is the repetition frequency of the modulation pattern, for example a sinewave. The modulated signal consists of a carrier wave having a pulse width which is determined by the frequency of the first clock signal and a modulation of a width equal to a number of counting steps of the first counter. Varying the frequency of the second clock signal at constant frequency of the first clock signal consequently causes the absolute modulation depth or the amplitude of said signal waveform to vary. If the frequency of the second clock signal is maintained constant, the absolute modulation depth is constant, but the relative modulation depth is proportional to the frequency of the first clock signal and thus to the repetition frequency of said signal waveform, so that the effective voltage value of the signal which is contained in the modulation is proportional to the repetition frequency of said signal, which for example in the case of motor control is a desired property.

As the complete circuit arrangement in accordance with the invention can be formed by means of logic elements, the arrangement is highly insensitive to supply-voltage and temperature variations and to drift. Moreover, the frequency and amplitude of the signal waveform which is contained in the modulation can be controlled very simply because these only depend on the frequency of clock signals which can readily be generated.

In respect of the first counter, it is advantageous that the counting direction of the first counter be reversible and that it count up from an initial count and, upon reaching a maximum count, be reversed and subsequently count down.

Thus, a symmetrical series of counts is generated so that a specific positive and the same negative modulation can be determind by the same count if the maximum count is taken as zero modulation. This is of particular advantage if said signal waveform is symmetrical about the zero axis so that in both the positive half and the negative half the same series of counts can be decoded.

If the first counter is an up/down counter, it is of advantage that at the counting input of the first counter a first gate circuit is included for suppressing the next pulse appearing at said counting input when the first counter has reached the maximum count.

Thus, the maximum count is maintained for two counting steps of the first counter, which improves the symmetry of the series of counts.

In the case of applications where the frequency of the first clock signal should be variable over a wide range, it is of advantage that said maximum count be a fixed count of the first counter, at which count the first counter is automatically reversed, and that said counter automatically stops upon reaching the initial count.

Owing to this step the number of counting steps per cycle of the first counter can be minimized so that, for example, a minimum number of bistable circuits is needed.

If the frequency of the first clock signal becomes too high or the frequency of the second clock signal becomes too low, overmodulation occurs, which means that a starting pulse appears before the first counter has reached the initial count again. The step which solves this problem is characterized in that the circuit arrangement includes a second gate circuit for producing starting pulses in synchronism with the first clock signal, which starting pulses each time start the first counter, and for generating set pulses, which set pulses are 180° phase-shifted relative to the starting pulses and set the first counter to the maximum count at instants that these set pulses appear while the first counter still counts up.

In respect of the sequential network it is of advantage that the sequential network comprises a bistable circuit which is always changed over at the same count of the first counter so as to generate a carrier wave, a third gate circuit for the parallel generation of all the required modulation pulses which each have a width which is determined by the said signal waveform and which each extend in at least one direction from the count at which the bistable circuit is changed over, and a sequential modulator circuit which in a sequence which is determined by said signal waveform modulates the carrier wave with each time one of the modulation pulses.

Thus, optimum use can be made of symmetries of said signal waveform. Generally, the number of different modulation depths per period of said signal waveform will be substantially smaller than the absolute number of modulation depths required.

In order to achieve a minimal harmonic distortion of said signal waveform it is of advantage for the sequential network that the sequential modulator circuit be adapted to modulate the carrier wave both on the rising and the falling edges.

In a circuit arrangement in accordance with the invention in which all the required modulation pulses are generated in parallel it is of advantage that said third gate circuit generates all the required modulation pulses symmetrically relative to that count of the first counter at which the bistable circuit is changed over.

Owing to this step a specific modulation pulse may be utilized both for a positive and a negative modulation. These symmetrical modulation pulses can be generated most simply when the count at which the bistable circuit is changed over is the maximum count of the first counter.

In a circuit arrangement in accordance with the invention, said signal waveform being a sinewave, it is of advantage that the sequential modulator circuit comprises an n-counter to the counting input of which a counting signal is applied in synchronism with the first clock signal and with an output signal whose frequency bears a ratio of n:1 to the frequency of the input signal, a six-counter to the input of which the output signal of the n-counter is applied, one counting cycle of the six-counter corresponding to one period of said sinewave, a fourth gate circuit by means of which upon command from the n-counter all the modulation pulses required for the first 60° of the sinewave are consecutively transferred to an output as a first pulse train, a fifth gate circuit by means of which upon command from the n-counter all the modulation pulses required for the second 60° of the sinewave are consecutively transferred to an output as a second pulse train, a sixth gate circuit by means of which upon command from the n-counter all the modulation pulses required for the third 60° of the sinewave are consecutively tranferred to an output as a third pulse train, while the first, second and third pulse trains thus realized by the fourth, fifth and sixth gate circuits are repeated upon each counting step of the six-counter, a first modulator circuit which upon a first, second and third counting step of the six-counter in this order supplies the first, second and third pulse train respectively and the carrier wave to a first modulation gate circuit, which combines the carrier wave and the respective pulse train in accordance with an AND-function, and which upon a fourth, fifth and sixth counting step of the six-counter in this order supplies the first, second and third pulse train respectively and the carrier wave to a second modulation gate circuit, which combines the carrier wave and the inverse of the respective pulse train in accordance with an OR-function, and a first output gate circuit which combines the output signals of the first and the second modulation gate circuit in accordance with an OR-function.

In this respect it is furthermore of advantage for generating three pulse-width modulated signals which are 120° phase-shifted relative to each other that the circuit arrangement further comprises a second modulator circuit which upon the third, fourth and fifth counting step of the six-counter in this order supplies the first, second and third pulse train respectively and the carrier wave to a third modulation gate circuit, which combines the carrier wave and the respective pulse train in accordance with an AND-function, and which upon the sixth, first and second counting step of the six counter in this order supplies the first, second and third pulse train respectively and the carrier wave to a fourth modulation gate circuit, which combines the carrier wave and the inverse of the respective pulse train in accordance with an OR-function, a third modulator circuit, which upon the fifth, sixth and first counting step of the six counter in this order supplies the first, second and third pulse train respectively and the carrier wave to a fifth modulation gate circuit, which combines the carrier wave and the respective pulse train in accordance with an AND-function, and which upon the second, third, and fourth counting step of the six counter in this order supplies the first, second and third pulse train respectively and the carrier wave to a sixth modulation gate circuit, which combines the carrier wave and the inverse of the respective pulse train in accordance with an OR-function, a second output gate circuit which combines the output signals of the third and fourth modulation gate circuits in accordance with an OR-function, and a third output gate circuit which combines the output signals of the fifth and sixth modulation gate circuits in accordance with an OR-function.

If a circuit arrangement in accordance with the invention is employed for motor control by means of power switches, the average frequency with which these switches are switched corresponds to the carrier frequency. In view of the frequency response of the motor said switching frequency has a minimum value, for example 660 Hz, and, in view of the maximum switching speed, a maximum value for example, 1000 Hz. As a result of this, the carrier frequency should also lie within a frequency range corresponding thereto. However, the motor speed should be variable for example from 0.1 Hz to 60 Hz and thus the frequency of the first clock signal, which is coupled therewith, should be variable over a corresponding frequency range. This means that the ratio of the carrier wave frequency and the repetition frequency of the modulation pattern, i.e. the adjusted motor speed, should be variable in steps. For this, the circuit arrangement in accordance with the invention is characterized in that the arrangement comprises a circuit for generating starting pulses for the first counter in synchronism with the first clock signal, the ratio of the frequency of the first clock signal to the repetition frequency of the starting pulses being 1:a, first means for adjusting the factor a, a first adjustable divider which is included between the input of the first counter and the input for the second clock signal, which first adjustable divider divides the second clock signal by a factor b, and a second means for adjusting the factor b in such a way that the ratio b/a is constant.

If the factor a is variable by a factor 1, 2, 4 and 8 respectively, the repetition frequency of the starting pulses for the maximum value of the factor a corresponds to the frequency of the counting signal for the n-counter and if the n-counter is for example a s-counter, the ratio of the carrier frequency to the repetition frequency of the modulation pattern, i.e. the sinewave, is 15, 30, 60 and 120 respectively. Since owing to the variation of the carrier frequency by factors 1, 2, 4 and 8 the number of pulses per period of the modulation pattern varies with factors 1, 2, 4 and 8, the absolute modulation depth should vary in an opposite manner so as to maintain the effective voltage value of the modulation pattern constant. This is achieved with said first adjustable divider.

A second method of varying said frequency ratio, as the case may be in conjunction with the first-mentioned method, is characterized in that the arrangement includes a second adjustable divider with a dividend m, from which divider an output signal is applied to the n-counter as a counting signal and which divider is included between the first input and a circuit for generating starting pulses for the first counter, the dividend being adjustable and the number of counting steps n of the counter being adjustable in such a way that the product nm is constant.

Since the product nm remains constant the repetition frequency of the modulation pattern always equals the same fraction of the frequency of the first clock signal, while the carrier frequency varies proportionally to 1/m. If the second method is combined with the first method and if n is switchable from 5 to 7, the ratios 21, 42, 84 and 168 are also realized in the present example and 8 different frequency ratios are possible.

It is of advantage that the circuit arrangement automatically selects the correct frequency ratio. For this purpose the frequency of the first clock signal must be measured. Accordingly the circuit arrangement in accordance with the invention is characterized in that the arrangement comprises a third input for generating a third clock signal, a reference counter for counting the pulses of the third clock signal, a circuit for deriving a periodic signal for starting and stopping the reference counter from the first clock signal, the counting time of the reference counter being determined by the frequency of the first counting signal, and the reference counter being reset after each counting period, a gate circuit for reading out the count of the reference counter at the end of each counting period of the reference counter, the gate circuit detecting counts of the reference counter within specific adjoining ranges, a memory circuit for storing the range detected by the gate circuit, and means for controlling the gate circuit as a function of the information stored in the memory circuit in such a way that a specific range which is detected by the gate circuit in the case that the information stored in the memory circuit corresponds to said range at both sides overlaps the corresponding range for which the gate circuit is sensitive in the case that the information stored in the memory circuit does not correspond to said range.

From the information stored in the memory circuit a signal can be derived for controlling the various adjustable dividers and counters. As the sensitivity of the gate circuit is varied in the afore-mentioned manner depending on the information stored in the memory circuit, a hysteresis is obtained which prevents the circuit from oscillating between two adjacent frequency ratios.

Figure 3:
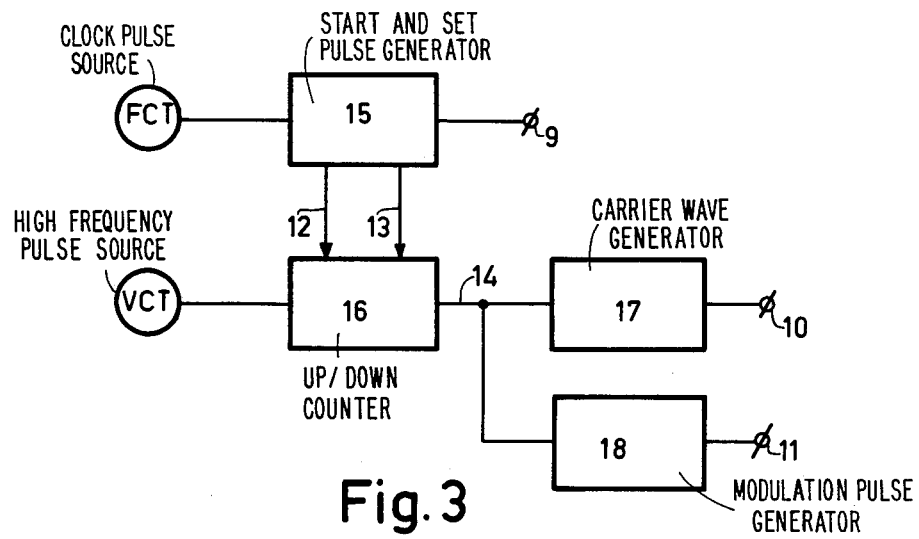
Figure 8:
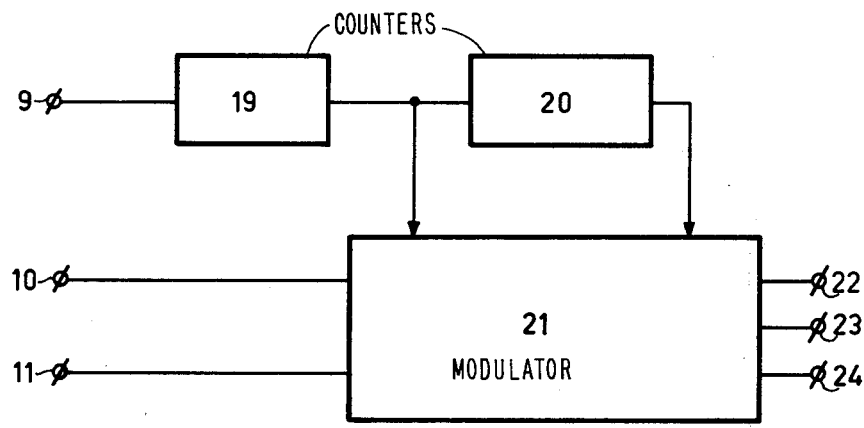
Figure 2:
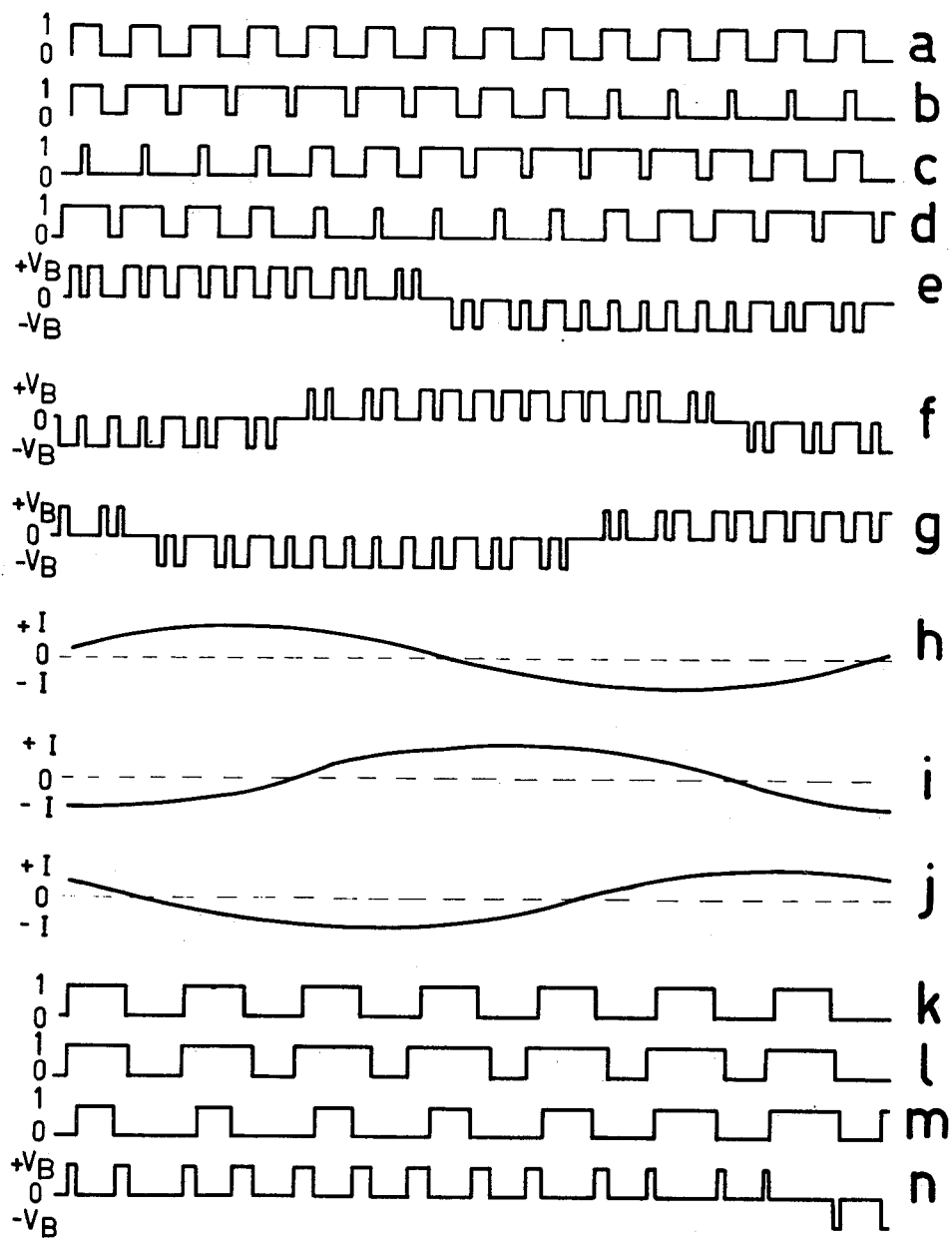
Figure 4:
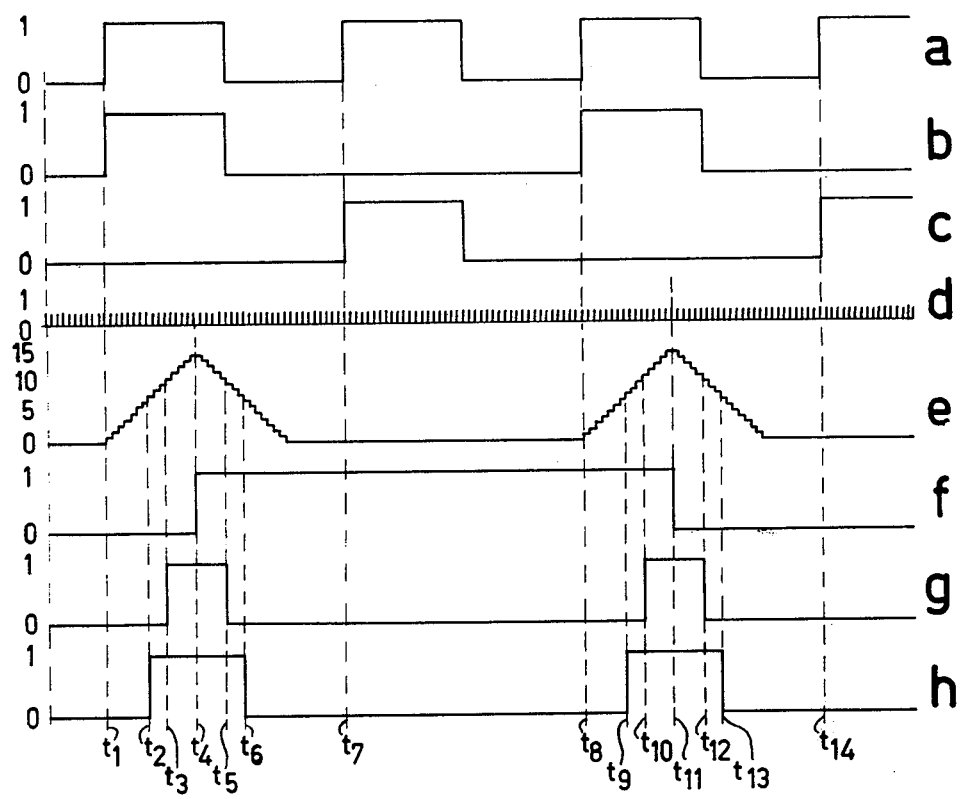
Figure 6:
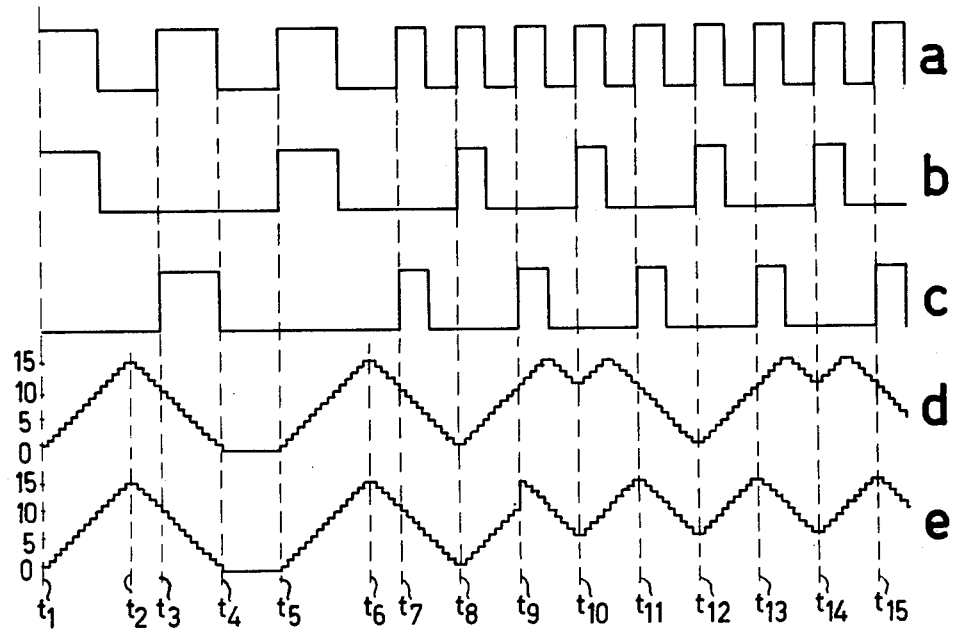
Figure 5:
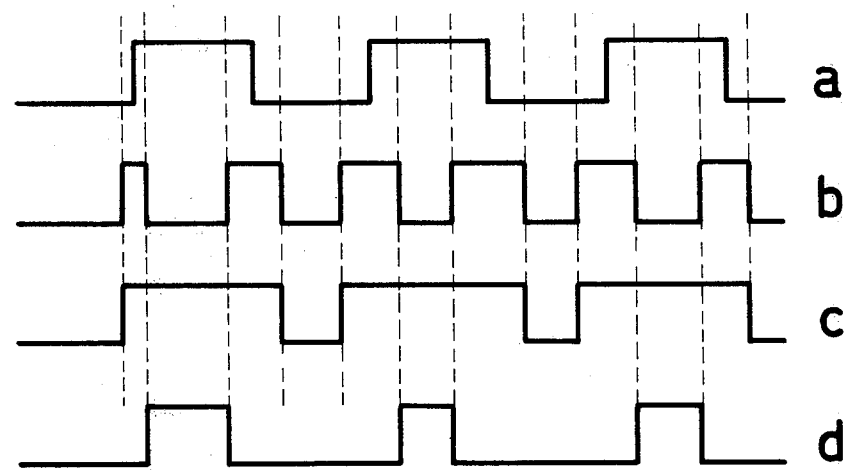
Figure 7:
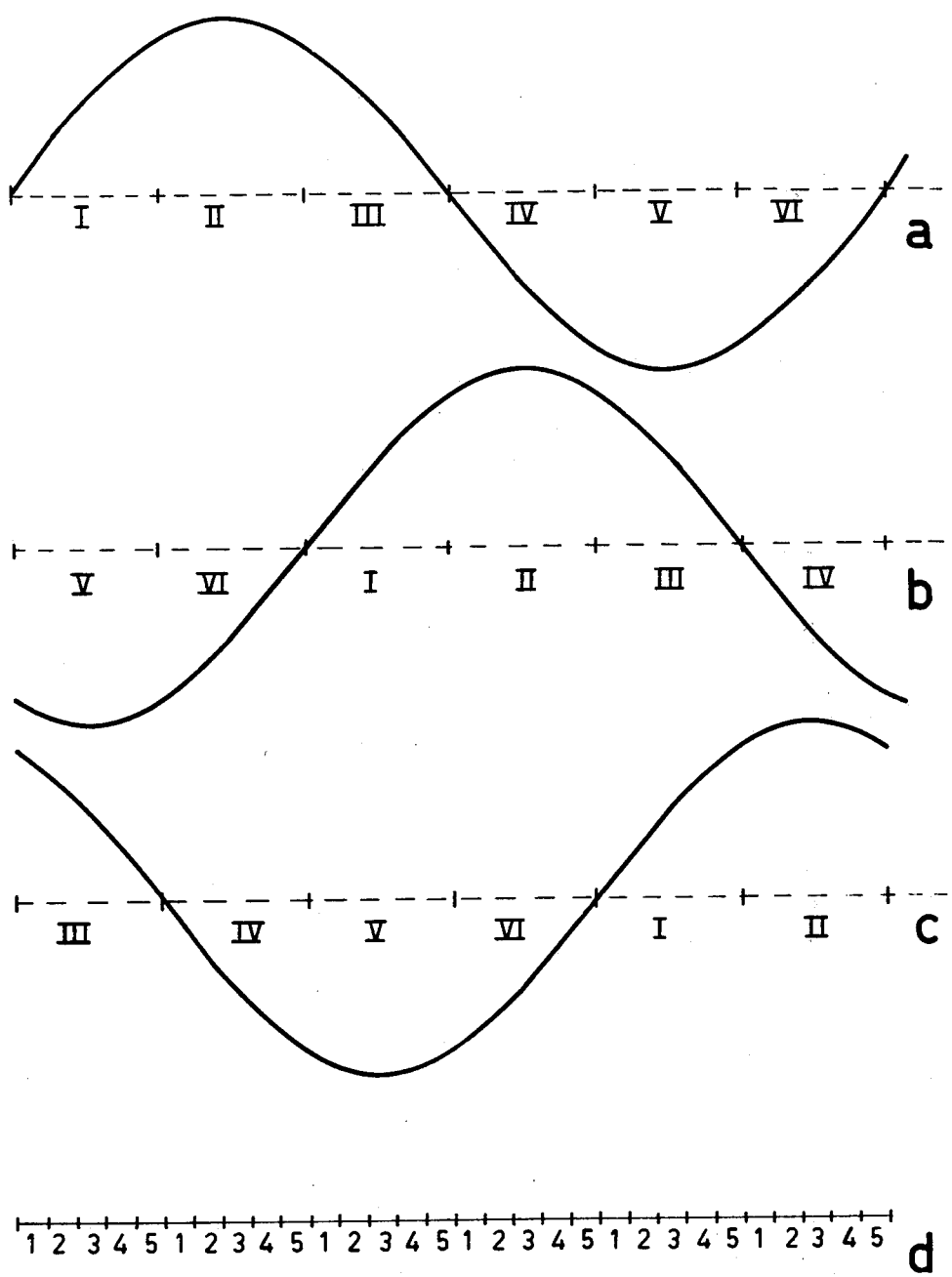
Figure 12:
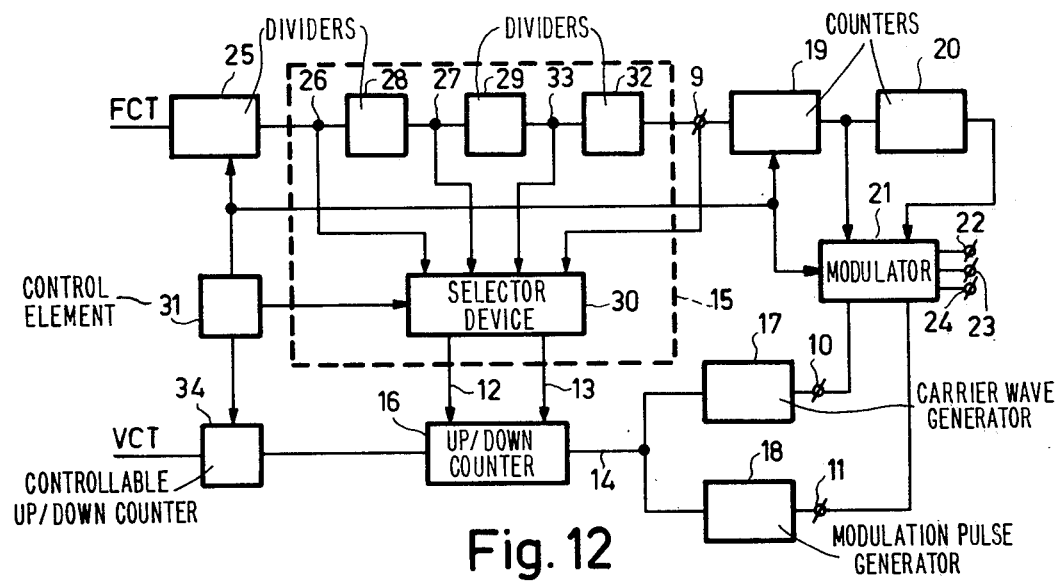
Figure 15:
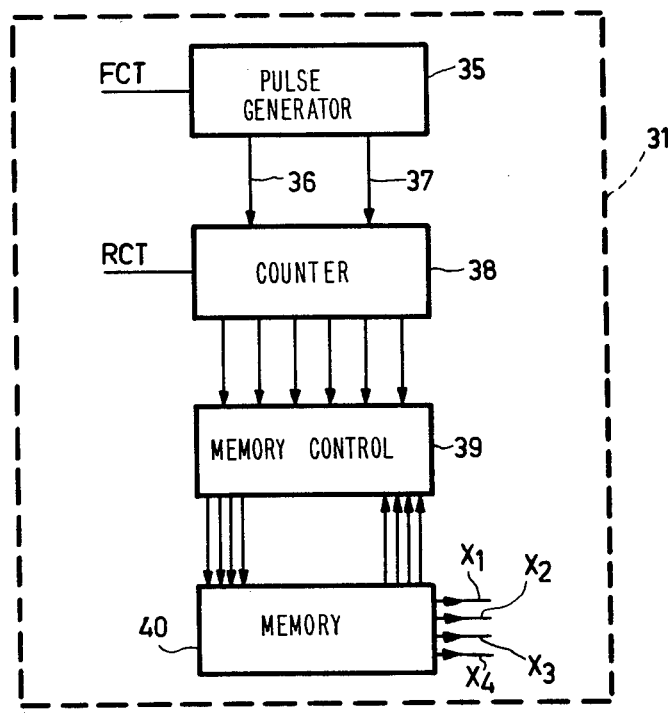
Figures 14, 16, 17:
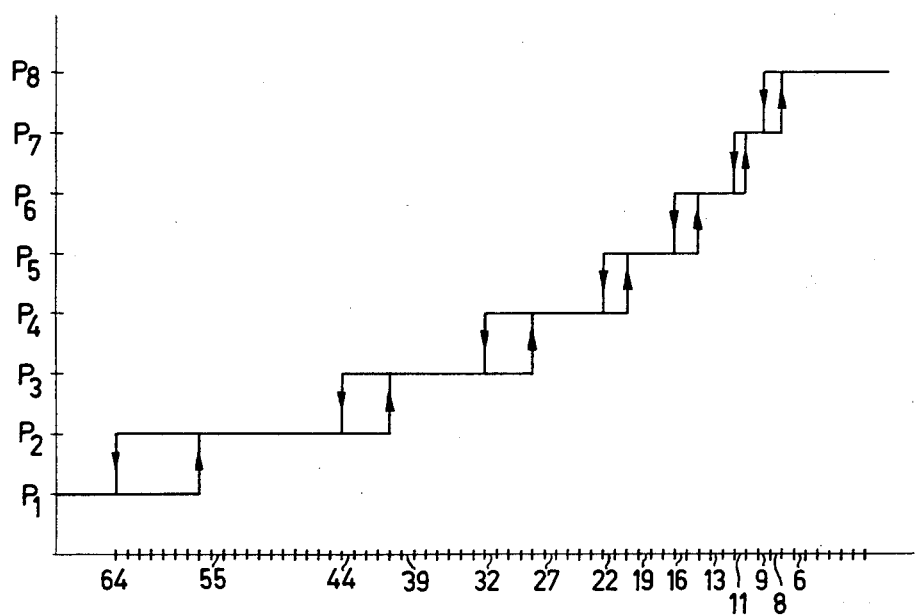
Figures 18, 20:
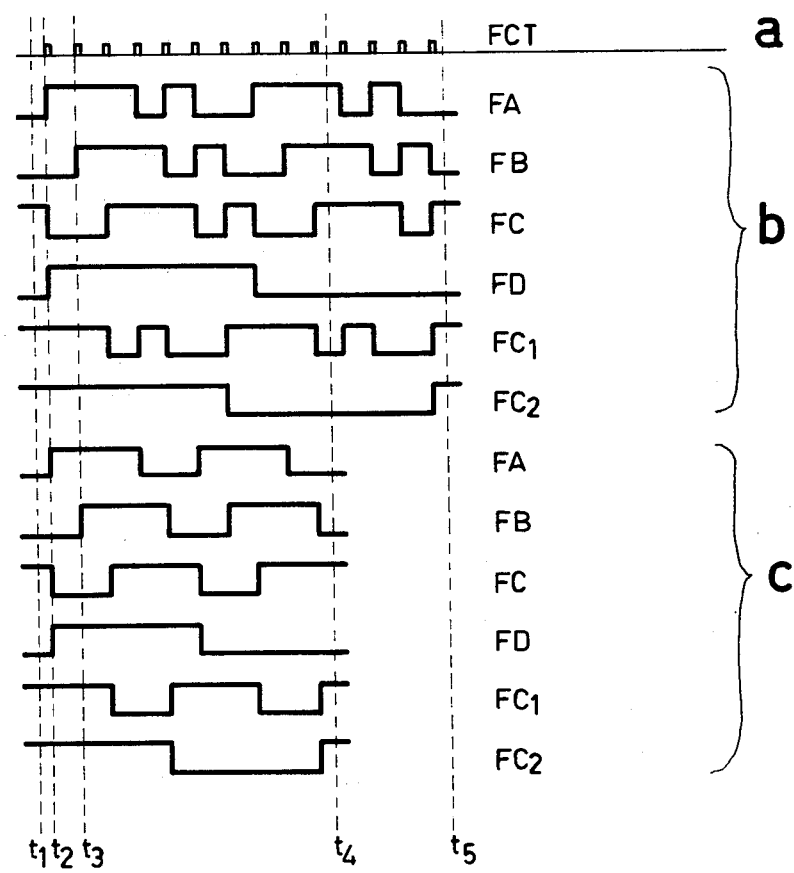
Figure 19:
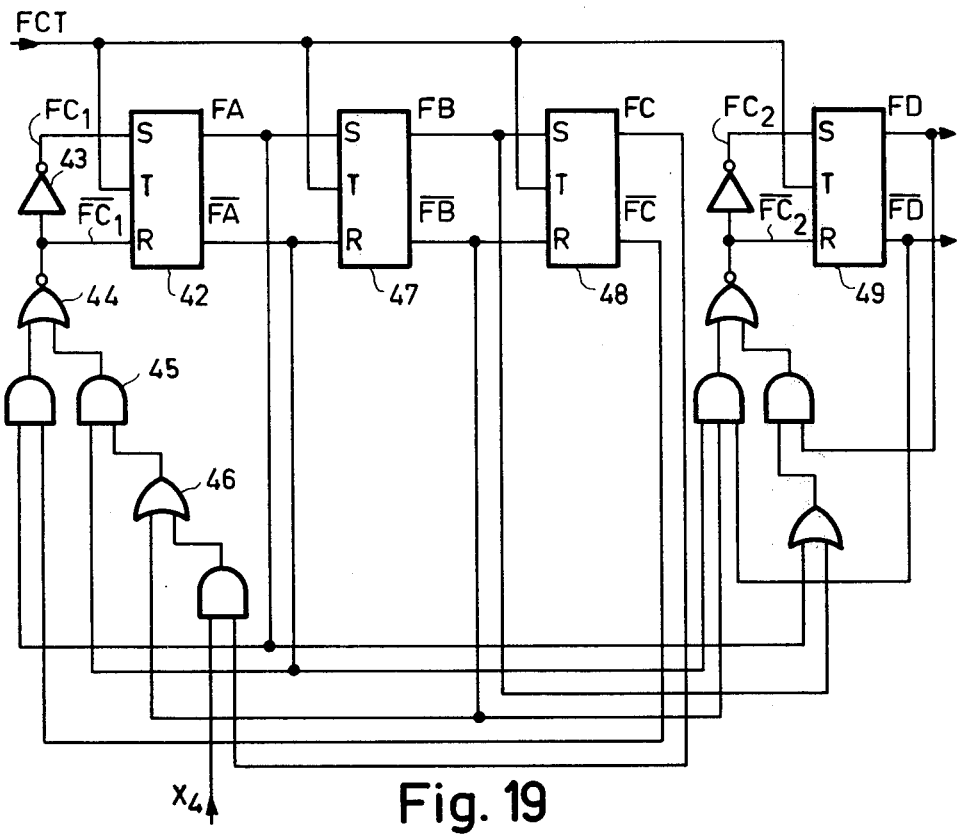
Figure 21:
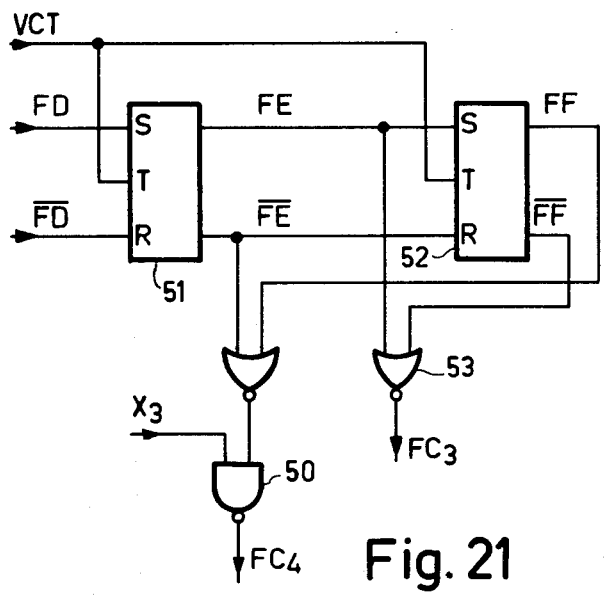
Figure 22:
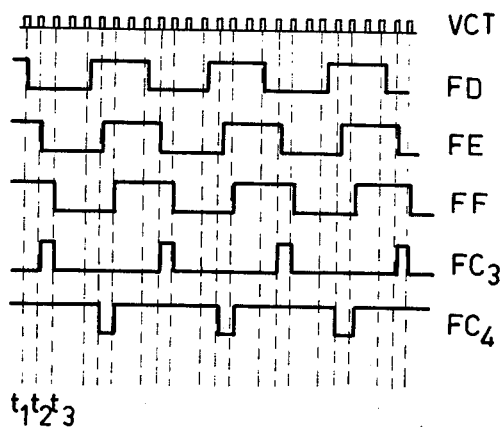
Figure 24:
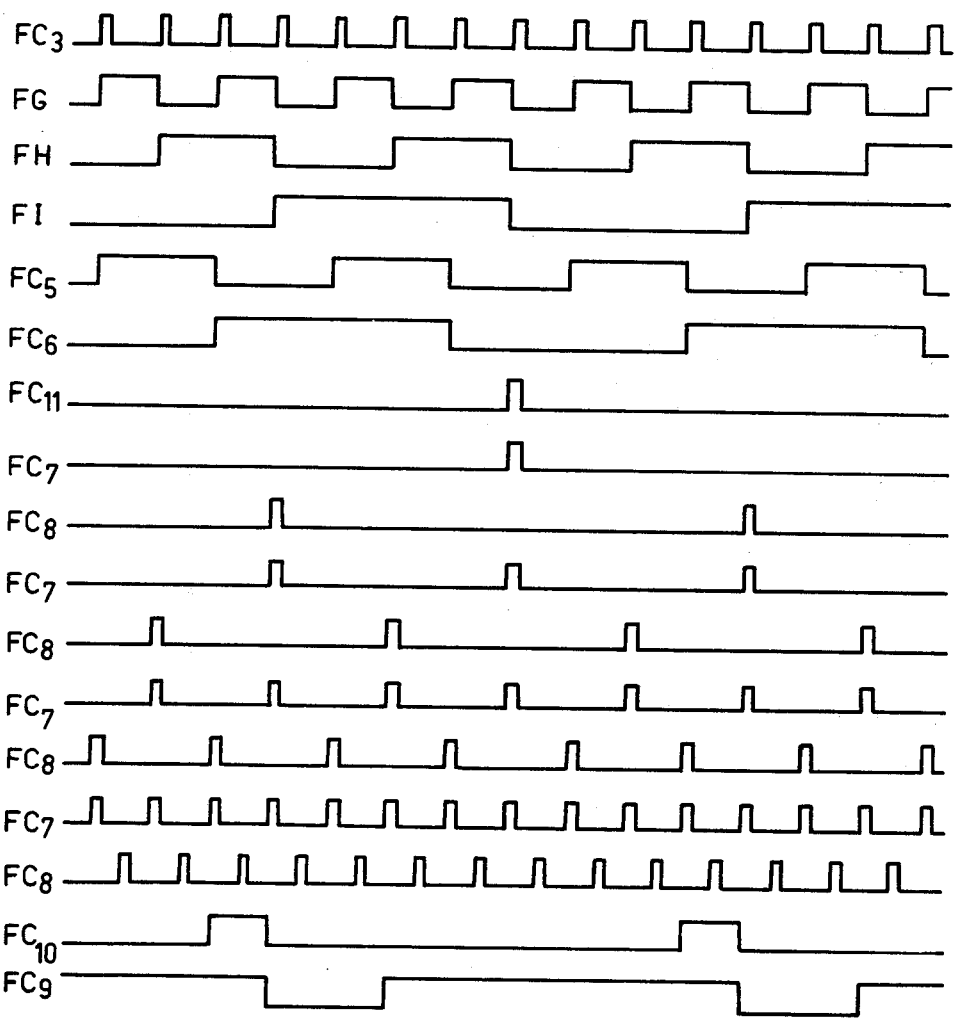
Figure 23:
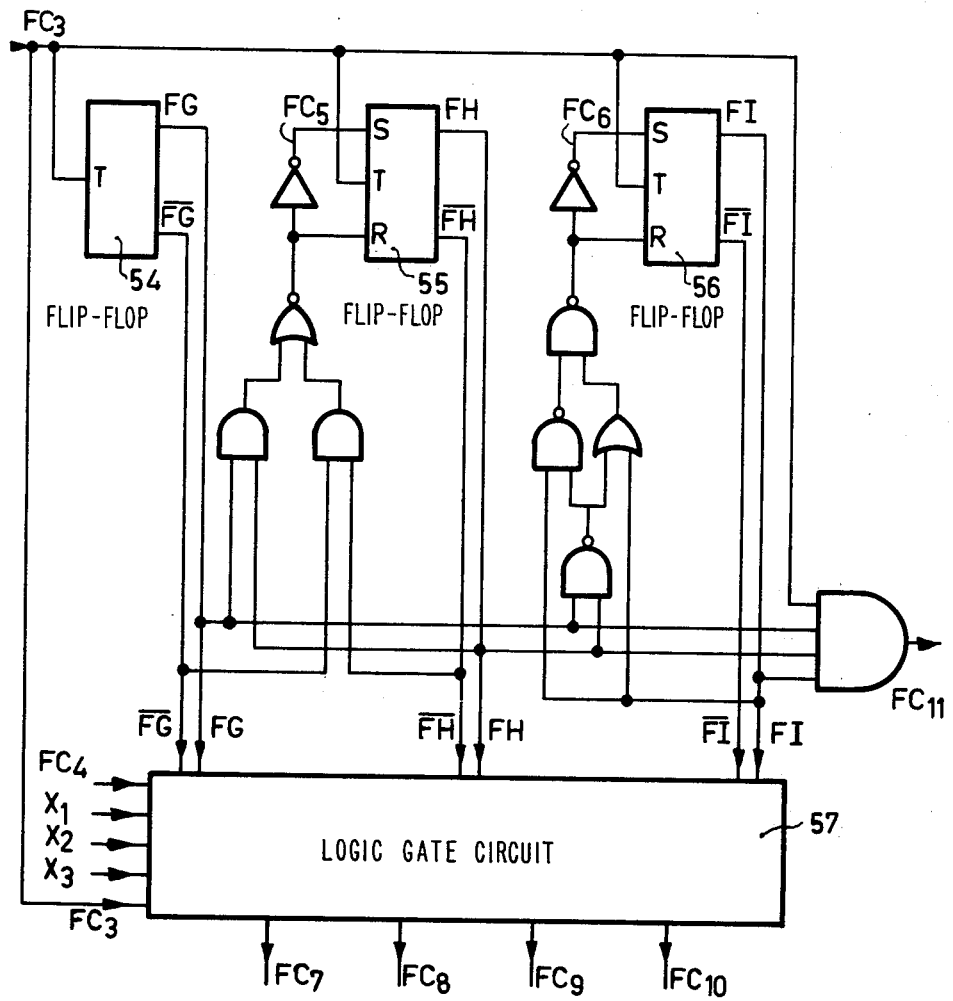
Figure 26:
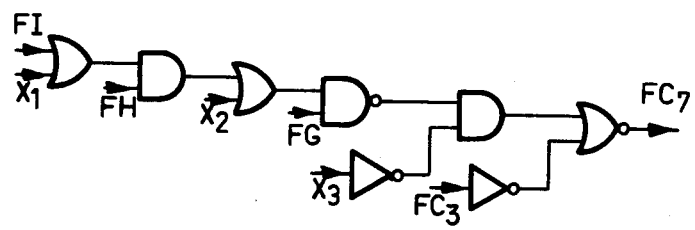
Figure 27:
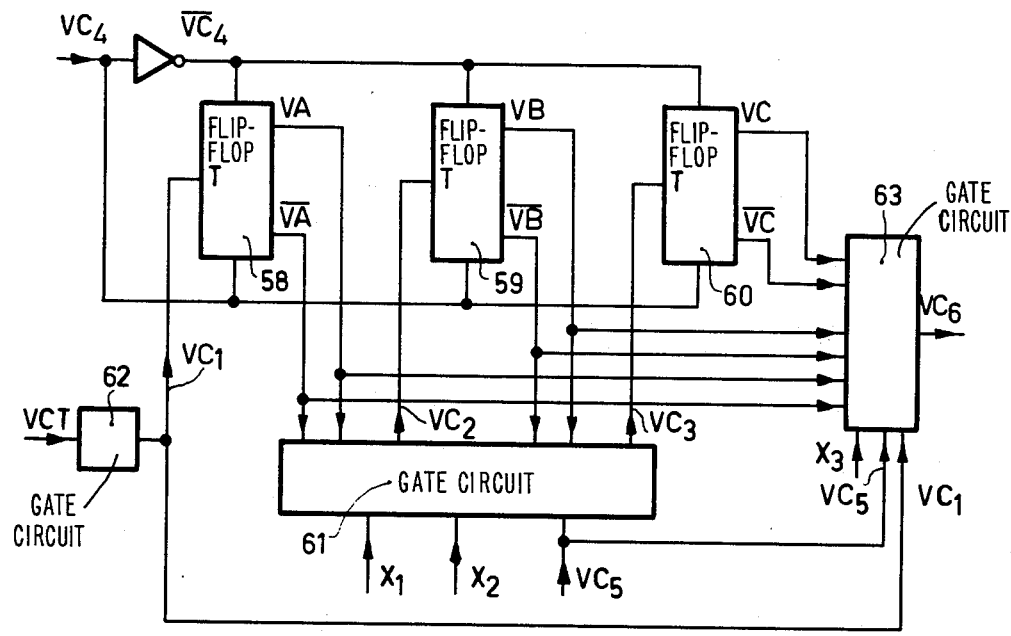
Figure 29:
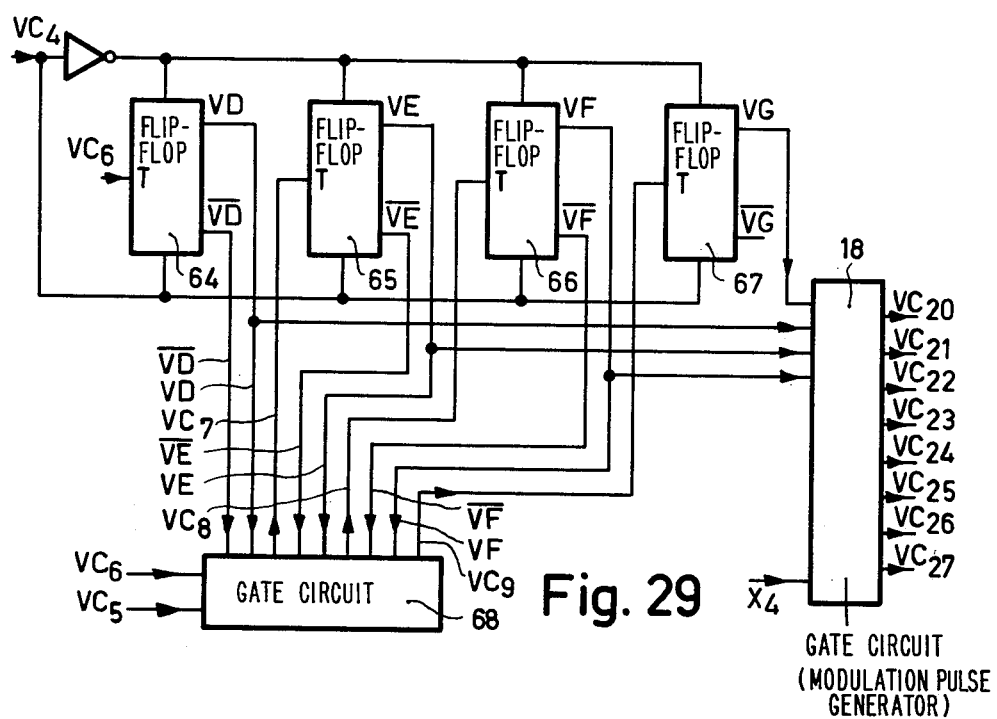
Figure 28:
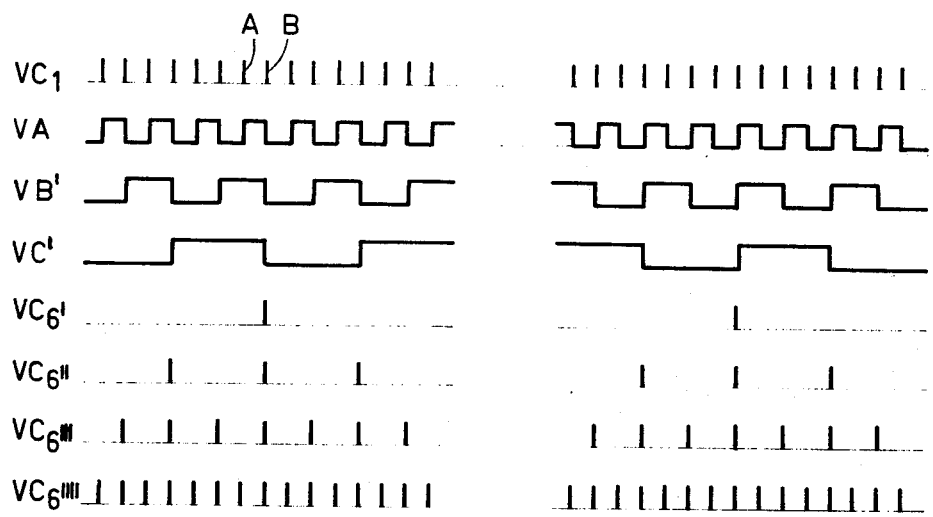
Figure 30:
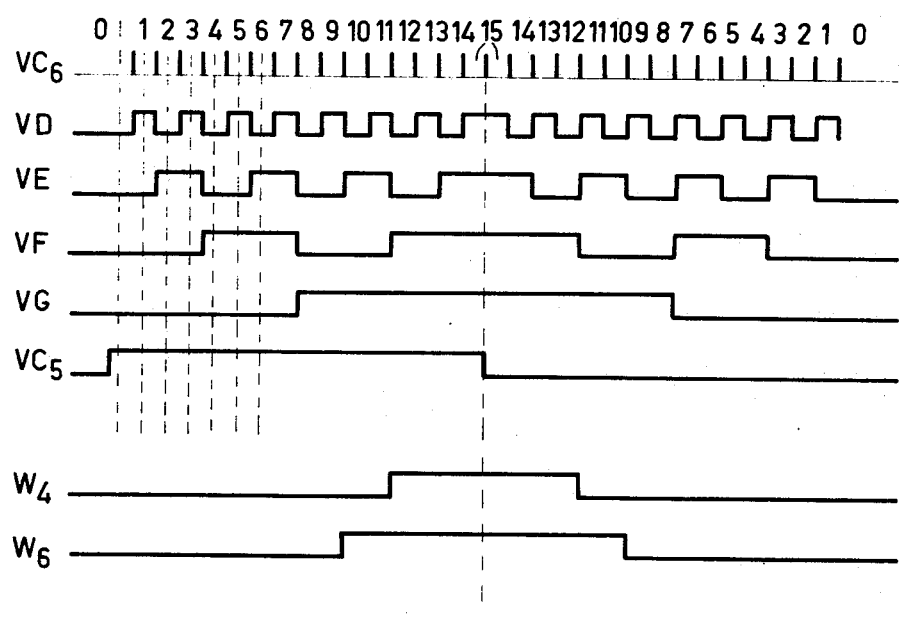
Figure 38:
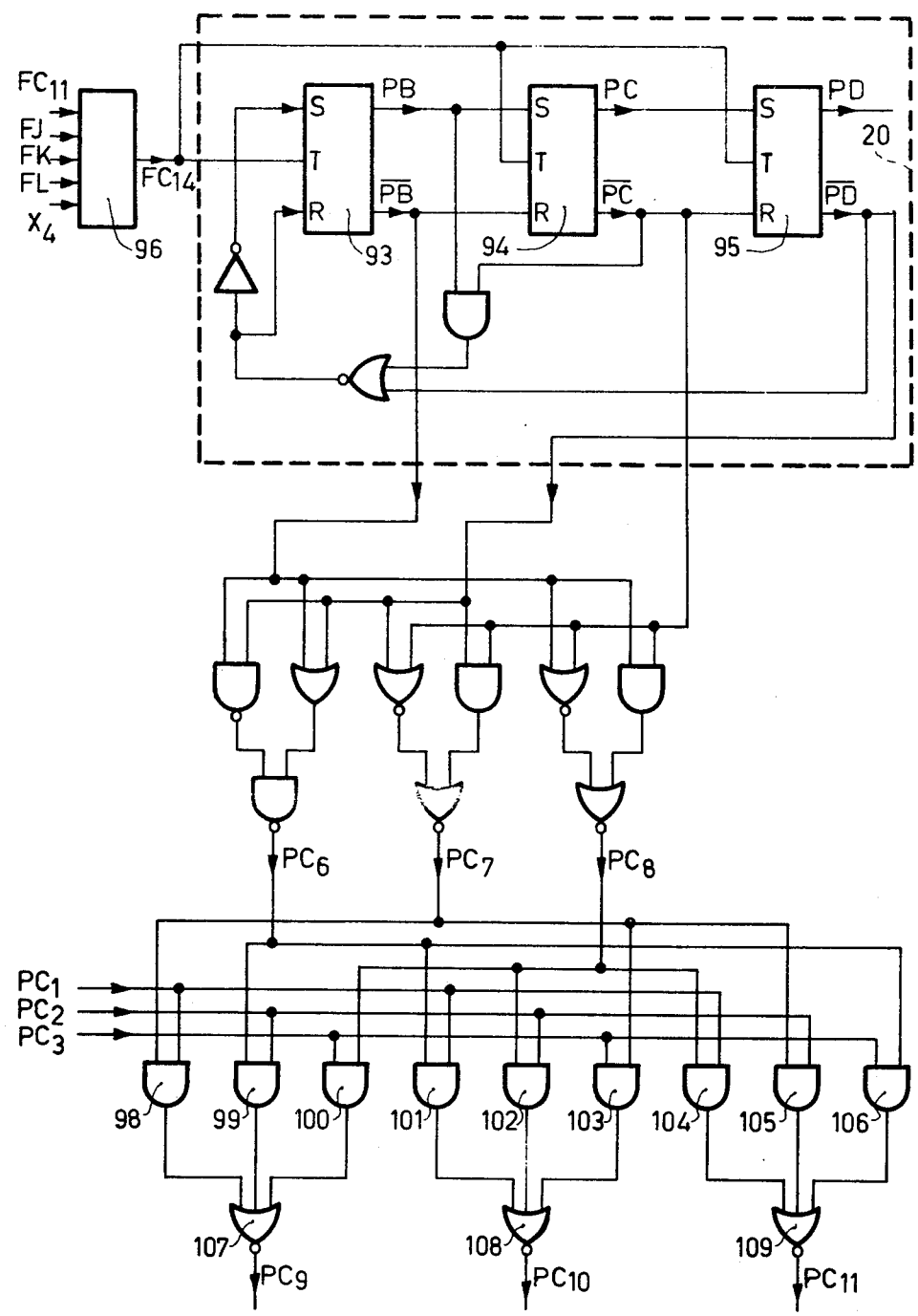
Figure 40:
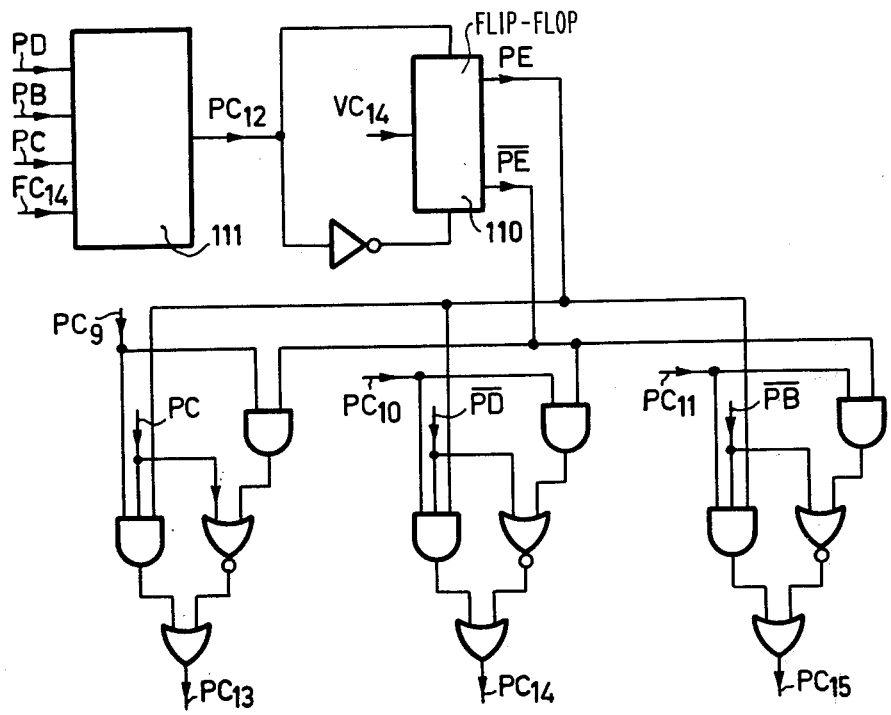
Figure 43:
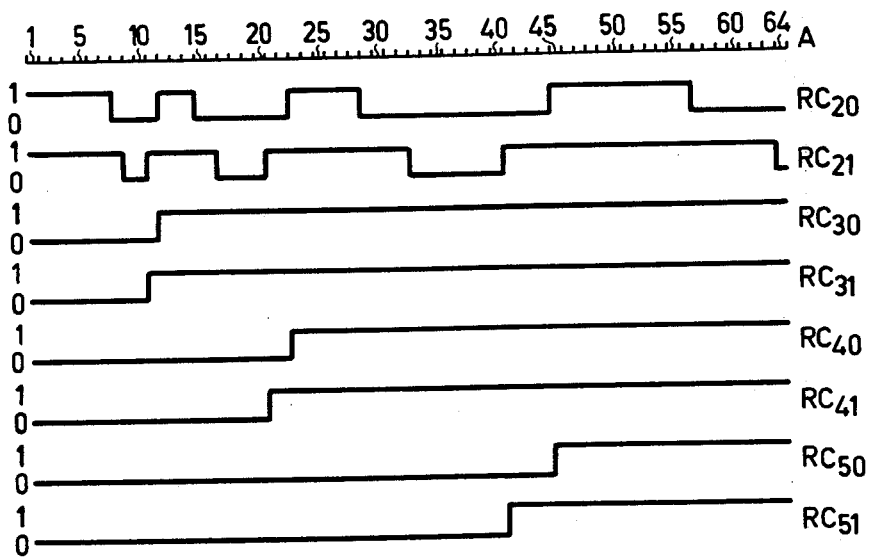
Figure 41:
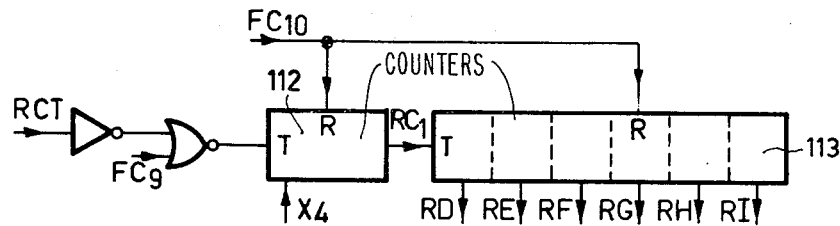
Figure 42:
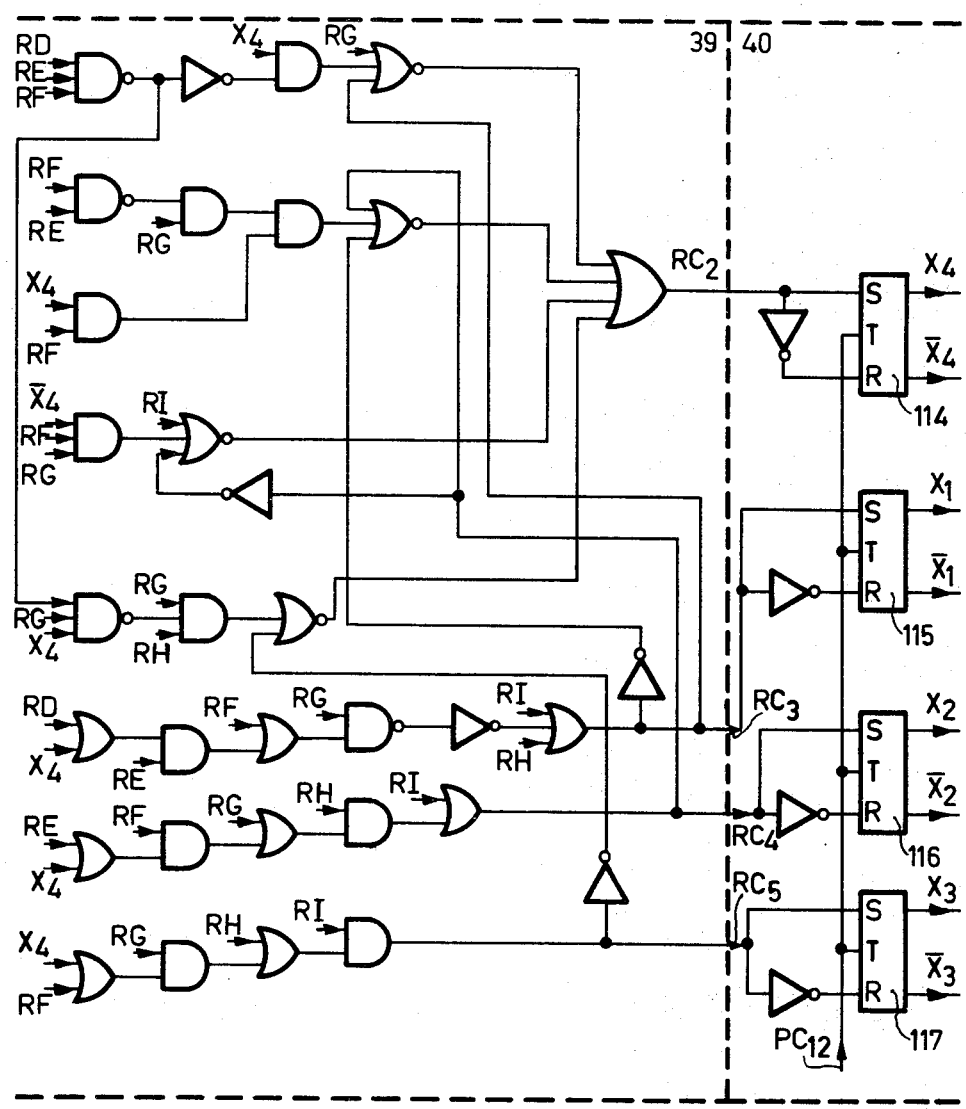

The invention will now be described in more detail with reference to the drawing. In the drawings:

FIG. 1 shows a motor control circuit to illustrate an application of the circuit arrangement in accordance with the invention, FIG. 2 shows a time diagram with a number of signal waveforms to illustrate the operation of the circuit arrangement of FIG. 1, FIG. 3 shows a block diagram of a circuit for generating a carrier wave and for generating modulation pulses for modulation of said carrier wave, FIG. 4 shows a time diagram with a number of signal waveforms to illustrate the operation of the circuit of FIG. 3, FIG. 5 is a time diagram with some signal waveforms to illustrate the use of symmetrical modulation pulses, FIG. 6 is a time diagram with some signal waveforms to illustrate the overmodulation problem and the solution thereto, FIG. 7 shows three sinewaves to explain the various symmetries, FIG. 8 is a block diagram of the sequential network, FIG. 9 is a table of various relative pulse-widths for a sinusoidal modulation, FIG. 10 is a function table with which the device 21 of the circuit of FIG. 8 should comply, FIG. 11 is a table of various frequency ratios and corresponding frequency ranges, FIG. 12 is a more detailed block diagram of the combination of the circuits of FIGS. 3 and 8, FIG. 13 is a table of various frequencies which appear in the circuit of FIG. 12 as a function of the selected frequency ratio P, FIG. 14 is a table corresponding to the table of FIG. 9 in the case where the counter 19 is a seven-counter, FIG. 15 is a block diagram of the control element 31 which determines the frequency ratio P, FIG. 16 is a table with a number of limit values for the frequency ranges which are distinguished by the control element of FIG. 15 and which exhibit hysteresis, FIG. 17 is a graph to illustrate the hysteresis effect, FIG. 18 is a truth table for the control signals which control the various adjustable counters and dividers, FIG. 19 is a switchable 14/10-divider, FIG. 20 is a time diagram to illustrate the operation of the divider of FIG. 19, FIG. 21 is a circuit for synchronizing the output signal of the divider of FIG. 19 with the second clock signal VCT, FIG. 22 is a time diagram relating to the circuit of FIG. 21, FIG. 23 is a circuit for generating start and set pulses for the up/down counter 16 and some signals for the control element 31 of FIG. 15, FIG. 24 is a time diagram relating to the circuit of FIG. 23, FIG. 25 is a function table pertaining to the device 57 of FIG. 23, FIG. 26 shows a gate circuit for realizing the functions in accordance with the table of FIG. 25, FIG. 27 shows the adjustable counter 34 of the circuit of FIG. 12, FIG. 27a is a function table pertaining to the device 61 of the divider of FIG. 27, FIG. 28 is a time diagram pertaining to the circuit of FIG. 27, FIG. 29 shows the up/down counter 16, FIG. 30 is a time diagram pertaining to the circuit of FIG. 29, FIG. 31 shows a gate circuit which realizes one of the functions of the table of FIG. 31a, FIG. 31a is a function table pertaining to the device 18 of the circuit of FIG. 29, FIG. 32 is a circuit for generating the signal $VC_5$ for the circuits of FIGS. 27 and 29, FIG. 33 shows a circuit for generating the signal $VC_4$ for the circuits of FIGS. 27 and 29, FIG. 34 is the detailed diagram of the circuit 62 and FIG. 27, FIG. 35 shows the switchable 5/7-counter 19, FIG. 36 is a function table in accordance with which the signals $PC_1$, $PC_2$ and $PC_3$ are generated for the circuit of FIG. 38, FIG. 37a shows a gate circuit for generating the signal $PC_1$, FIG. 37b shows a gate circuit for generating the signal $PC_2$, FIG. 37c shows a gate circuit for generating the signal $PC_3$, FIG. 38 shows a sequential circuit for arranging modulation pulses in the correct sequence for three signals which are 120° phase-shifted relative to each other, and the six-counter 20, FIG. 39 is a truth and function table pertaining to the circuits of FIGS. 38 and 40, FIG. 40 shows a circuit comprising the bistable circuit for generating the carrier wave and the modulating circuit for modulating said carrier wave, FIG. 41 is a block diagram of the reference counter 38 of the circuit of FIG. 15, FIG. 42 is a detailed diagram of the circuits 39 and 40 of FIG. 15, and FIG. 43 is a diagram pertaining to the circuit of FIG. 42.

To illustrate an application of a circuit arrangement in accordance with the invention, FIG. 1 shows the three windings 1, 2 and 3 of a three-phase induction motor. Via a switch 3 one side of the winding 1 is connected to a supply terminal with a voltage $+V_B$ and via a switch 4 to another supply terminal, which is connected to ground. Via a switch 5 the other side of winding 1 is connected to the voltage $+V_B$ and via a switch 6 to ground. One side of the winding 2 is connected to the connection point between the switches 5 and 6 and the other side to the voltage $+V_B$ via a switch 7 and to ground via a switch 8. One side of the winding 3 is connected to the connection point between the switches 7 and 8 and the other side to the connection point between the switches 3 and 4. The switches 3, 4, 5, 6, 7 and 8 are controlled from sources which carry control signals R, $\overline{R}$, Y, $\overline{Y}$, B and $\overline{B}$ respectively, which in this Figure is symbolically indicated by dashed arrows.

When the control signals are regarded as logic signals, a logic "1" representing the closed position of the corresponding switch and a logic "0" the open position, the control signals $\overline{R}$, $\overline{Y}$ and $\overline{B}$ are the inverted forms of the control signals R, Y and B. As a result of this each connection point between two associated switches either carries the voltage $+V_B$ or is connected to ground. For the voltages $V_1$, $V_2$ and $V_3$ across the windings 1, 2 and 3 respectively it then follows that:

$$V_1 = (R-Y) \cdot V_B$$
$$V_2 = (Y-B) \cdot V_B \qquad (1)$$
$$V_3 = (B-R) \cdot V_B$$

Care must always be taken that two corresponding switches cannot be closed simultaneously in order to prevent the supply voltage from being short-circuited.

The switches 3, 4, 5, 6, 7 and 8 are symbolically represented in FIG. 1 and will in practice be thyristors or transistors.

FIG. 2 shows a number of voltage waveforms illustrating the operation of the circuit arrangement of FIG. 1. FIG. 2a shows a rectangular carrier wave represented by the logic levels "0" and "1". FIG. 2b shows this carrier wave pulse width modulated, the modulation taking the form of the amplitude variation of a sinewave. The FIGS. 2c and 2d show the same modulated carrier wave shifted through 120° and 240° respectively, these phase shifts being related to the phase of the "sinewave" contained in the modulation.

If the three modulated carrier waves are the control signals R, Y and B, the voltages $V_1$, $V_2$ and $V_3$ across the windings 1, 2 and 3 respectively will have the waveforms shown in FIGS. 2e, 2f and 2g respectively in accordance with the relationship given by expression (1). In this respect it is to be noted that the carrier wave (FIG. 2a) does not show in these voltage waveforms and that these voltage waveforms exclusively comprise the modulations.

As the windings 1, 2, 3 of the motor form a low-pass filter the currents through the windings, if the carrier frequency is sufficiently high, will vary in accordance with the pulse-width variation of the voltages $V_1$, $V_2$ and $V_3$ respectively and will consequently consist of three sinusoidal currents which are 120° phase-shifted relative to each other. These currents, from which the ripple owing to upper harmonics has been removed, are shown in the FIGS. 2h, 2i and 2j respectively.

FIG. 2k shows a carrier wave having a frequency equal to half the frequency of the carrier wave shown in FIG. 2a. If this carrier wave is modulated with the same absolute modulation as the carrier wave of FIG. 2a, this again results in three control signals R, Y and B of which the control signals R and Y are shown in FIGS. 2l and 2m respectively. For example for the voltage $V_1$ across the winding 1 a waveform as shown in FIG. 2n is then obtained. It is found that the voltage pulses of which the voltages $V_1$, $V_2$ and $V_3$ consist have the same width as this voltage formed by means of a carrier wave with a different frequency, but have a different repetition frequency. As a result, the "voltage" of the sinewave is proportional to frequency so that the flux in the motor becomes frequency independent, which is a desired property.

Another desired property is to minimize the harmonic distortion of the motor currents. It is found that modulation of a carrier wave on both edges is much more advantageous in this respect than modulation on only one of the two edges.

FIG. 3 shows a block diagram of a circuit for generating a carrier wave and generating modulation pulses for modulating said carrier wave, allowing the widths of the modulation pulses to be selected independently of the carrier frequency and modulation pulses being generated both on the rising and the falling edge of the carrier wave. The circuit includes a device 15 for generating start pulses and set pulses in synchronism with a clock signal obtained from a source FCT. These start and set pulses are applied to an up/down counter 16 via connections 12 and 13, which counter counts the pulses from a source VCT in such a way that the counter starts at the instant that a start pulse appears and after reaching a specific count counts back in the opposite direction and subsequently stops in anticipation of a new start pulse. The (logic) output signal at an output 14 of the up/down-counter 16 is applied to a device 17 for generating a carrier wave in synchronism with the start pulses but delayed (and thus in synchronism with the signal FCT), for example by driving a flip-flop at the instants that the up/down counter 16 is at its maximum count. The output signal at the output 14 is also applied to a device 18 for generating modulation pulses, for example by detecting a specific count of the up/down counter 16 with the aid of a gate circuit and driving a flip-flop at this count, so that pulses are obtained which are symmetrical about the edges of the carrier wave and have a width which is determined by said count of the counter and thus by the frequency of the signal VCT.

The operation of the circuit of FIG. 3 will be explained with reference to FIG. 4. FIG. 4a shows the signal FCT as a squarewave signal with logic levels "0" and "1". The start impulses are derived therefrom by means of the device 15, for example by transferring every second pulse by means of a gate circuit. Obviously it is also possible to select for example every fourth pulse, or every eighth pulse, etc. Furthermore, set pulses are generated in a similar way, but 180° phase-shifted relative to the start pulses. The start and set pulses are shown in FIGS. 4b and 4c respectively. FIG. 4d shows a signal VCT with a frequency which is substantially higher than that of the start pulses.

At the instant $t_1$ the up/down counter 16 is started on the rising edge of a start pulse, the count appearing at the output 14 of said counter, for example as a binary code. This output signal is symbolically shown in FIG. 4e as a stepped curve whose height represents the count. In the present instance a 16-counter has been selected with a code for the number "15" as the maximum count. When this count "15" is reached the counting direction of the counter is automatically reversed and the counter counts down to its initial count, this is a logic code for the count "0". On the rising edge of a subsequent start pulse, at the instant $t_8$, this cycle is repeated.

The device 17 responds to the counts "15" and thus generates a carrier wave as shown in FIG. 4f. The edges of this carrier wave coincide with two successive counts "15" of the counter ($t_4$ and $t_{11}$) so that, in respect of the frequency, said carrier wave is in synchronism with the signal FCT.

FIGS. 4g and 4h show modulation pulses which appear when a gate circuit responds to counts "11" and modulation pulses which appear when a gate circuit responds to counts "8". The widths of these modulation pulses are then ten and sixteen counting steps respectively, so that the widths of the modulation pulses are determined by the frequency of the signal VCT.

In this respect it is to be noted that it is desirable that the maximum count of the counter be sustained for two counting steps, which can be achieved by suppressing the next pulse of the signal VCT upon reaching said maximum count, e.g. with the aid of a gate circuit. The reason why this is desirable is that logic circuits change state upon pulse edges so that the flip-flop which generates the carrier wave can change over exactly in the middle of a counting cycle. These are the instants $t_4$ and $t_{11}$ in FIG. 4. Owing to this step the modulation pulses are generated symmetrically about the edges of the carrier wave.

It follows from the shape of the signal to be obtained, as discussed with reference to FIG. 2, that the pulses of the carrier wave must be widened during the positive half-cycle of a "sinewave" and narrowed during the negative half-cycle. This can be effected by applying the carrier wave and the modulation pulses to an OR-gate during the positive half-cycle and by applying the carrier wave and the inverted modulation pulses to an AND-gate during the negative half-cycle. It is possible to use the same modulation pulse train both during the negative and the positive half-cycle of the "sine-wave" because with an arrangement in accordance with the invention the generated modulation pulses are symmetrical about the edges of the carrier wave. This can be explained with reference to FIG. 5, in which FIG. 5a shows a carrier wave and FIG. 5b a specific train of modulation pulses. When these two signals are applied to an OR-gate, the signal of FIG. 5c is obtained, the carrier wave pulses being widened, and when the signal of FIG. 5a together with the inverse form of the signal of FIG. 5b is applied to an AND-gate, the signal of FIG. 5d is obtained, the carrier wave pulses being narrowed.

The description with reference to FIG. 4 is based on an up/down counter 16 with a fixed number of counting steps. In principle it is possible to start from an up/down counter with a variable number of counting steps, for example by reversing the counting direction exactly half-way between two start pulses. As a result, the counter each time starts counting up immediately after counting down. A drawback of this is inter alia that a large number of two-dividers is needed for the counter. Another possibility is to use a counter which counts in one direction only and which is reset to its starting position each time that the maximum count is reached. For generating the carrier wave it is then possible to start from a central count. However, this solution also is not attractive compared with the first-mentioned solution if overmodulation has to be accepted. In the case of the first mentioned solution it appears to be very simple to solve the problems associated with overmodulation, which will be explained with reference to FIG. 6.

FIG. 6a shows the signal FCT whose frequency is doubled at the instant $t_7$, FIG. 6b shows the start pulses for the up/down counter 16 derived therefrom, and FIG. 6c shows the set pulses derived therefrom. FIG. 6d symbolically shows the output signal of the counter 16 if no additional steps are taken to solve the problems associated with overmodulation, and FIG. 6e shows the output signal if such steps have been taken. The counter is started on the rising edge of a start pulse, the instant $t_1$, and reaches its initial count again after a complete counting cycle at the instant $t_4$ before a subsequent start pulse appears at the instant $t_5$. However, after the frequency doubling the start pulses recur so rapidly that it is not possible to complete a full counting cycle between two start pulses. The counting pattern which is then obtained is shown in FIG. 6d after the instant $t_8$. A carrier wave generated with this counting pattern will no longer exhibit a constant pulse duration. Moreover, certain modulation pulse widths will overlap at the one instant and will not overlap at the other instant.

The step taken in order to obtain a regular counting pattern despite overmodulation consists of setting the counter 16 to its maximum count (the count "15") at the instant that a set pulse appears, while the counter counts in the first half of a counting cycle. This is shown in FIG. 6e in which at the instant $t_9$ a set pulse appears before the counter has reached its maximum count. In the present example the repetition frequency of the start pulses corresponds to 20 counting steps after the instant $t_7$. After the counter has been set to its maximum count at the instant $t_9$, it counts back ten steps after which the next start pulse occurs and it counts ten steps upwards again. At this instant $t_{11}$ the next set pulse appears, but the counter has already reached the maximum count and begins to count down. Now a regular counting pattern is obtained again, the carrier wave to be generated being regular and the modulation pulses which overlap each other (because they are wider than 20 counting steps) always overlapping each other.

In the circuit of FIG. 3 the carrier wave and the modulation pulses are generated separately and are subsequently combined by gate circuits. In principle, it is possible to generate the modulated carrier wave directly by for example changing over a flip-flop at the correct instant with the aid of a sequential storage circuit. Thus it is, for example, possible to change over a flip-flop at the instants $t_3$ and $t_{12}$ instead of applying the signals in accordance with FIGS. 4f and 4g to an OR-gate.

However, a system has been opted for in which the carrier wave and all the modulation impulses which are required are generated in parallel, which system will be described in further detail, but in addition to the said alternative it is in principle also possible for example to generate at every instant only the modulation pulse required at that instant.

However, because three signals must be composed which only differ in respect of phase and because these signals exhibit a number of symmetries, the selected system appears to be most advantageous as regards the number of gates which is required. As an example, a substantial part of the system would have to be triplicated in the case of the two aforementioned alternatives.

Since all the modulation pulses which are required and the carrier wave are generated in parallel, the three desired output signals must be derived therefrom. The three sinusoidal signals which are contained in the pulse-width modulated signals are then used as a basis (see FIG. 2). The term "sinewave" is to be understood to mean the said modulation. FIG. 7 shows three "sinewaves" which are shifted 120° relative to each other (FIGS. 7a, 7b and 7c). The axes are divided into parts of 60° which are numbered I through VI. Corresponding parts of the three "sinewaves" are correspondingly numbered. Underneath these three "sinewaves" FIG. 7d shows an axis by means of which each part is divided into 5 equal portions of 12° each.

The Figure shows that there are a number of symmetries. Part I is miror-symmetrical relative to part III, part II is symmetrical around 90°, and the parts IV, V and VI are identical to the parts I, II and III in respect of amplitude but differ in sign. For the last three parts the same modulation pulses may be used as for the first three parts, if the modulation technique described with reference to FIG. 5 is utilized. In total each "sinewave" is thus divided into 30 portions.

For each portion the width w of the modulation pulse required at that portion can be determined by relating this width to an integral of the sinewave through an angle of 12° around these portions. This yields for example the pulse widths which are rounded off to integers (because the widths are related to a number of counting steps of the counter 16), which are listed in the table shown in FIG. 9. In this table the three columns correspond to the parts I, II and III and the five rows to the portions 1 through 5.

It follows from this table that in total 6 modulation pulses of different widths must be generated. The table should then be incorporated into the logic so that for each portion the correct modulation pulse assigned to the edges of the carrier wave will appear within said portion.

FIG. 8 shows the block diagram of a circuit with the above-mentioned function. The signal FCT or a signal which is obtained after dividing the signal FCT by a fixed number can be taken from the output 9 of the device 15 (FIG. 3). This signal is applied to a five-counter 19 whose output signal is fed to a six-counter 20. The output signal of the six-counter 20 is an indication of the parts I through VI and the output signal of the five-counter is an indication of the portions 1 through 5. These output signals are applied to a modulator 21 of which an input 10 is connected to the output 10 of the device 17 for generating the carrier wave and of which inputs 11 (six-fold) are connected to outputs 11 of the device 18 for generating the modulation pulses. Three pulse-width modulated signals which are 120° phase-shifted relative to each other are now available at the outputs 22, 23 and 24 (in accordance with the signals shown in FIGS. 2b, 2c and 2d). The device 21 should comply with the function in accordance with the table of FIG. 10, which function can simply be realized with logic gates and will be described in more detail hereinafter.

In the table of FIG. 10 the columns correspond to the counts of the six-counter 20, decimally numbered 1 to 6 (in reality a 3-bit binary code) and the rows correspond to the counts of the five-counter 19, decimally numbered 1 to 5 (in reality also a 3-bit binary code). These rows have been triplicated (A, B and C) for the three output signals at the outputs 22, 23 and 24. At the intersections of the columns and the rows the logic functions are indicated of the variables to be transferred to the respective outputs for the relevant counts of the five-counter and the six-counter. These functions are the modulation functions discussed with reference to FIG. 5. Reference character C represents the carrier wave and $w_3$, $w_6$, $w_9$, $w_{11}$, $w_{12}$ and $w_{14}$ represent the modulation pulses with the respective relative widths 3, 6, 8, 11, 12 and 14 (see FIG. 9). The sign (+) represents an "OR"-function and the sign (.) and "AND"-function. The positions in the table are passed-through column by column from top to bottom and from left to right because the six-counter 20 has been included after the five-counter 19. For example, for count 2 of the five-counter and count 3 of the six-counter the carrier wave and the modulation pulse of a relative width "11" are transferred to the output 22 through an "OR"-function, the carrier wave and the modulation pulse of a relative width "3" to an output 23 through an "OR"-function, and the carrier wave and the inverted modulation pulse of a relative width "14" to an output 24 through an "AND"-function.

In order to enable the phase sequence of the three signals to be inverted so as to enable the direction of rotation of a motor to be reversed, the device 21 may include a cross switch which is realized with the aid of logic gates, which causes the signals at for example the outputs 23 and 24 to be interchanged.

From the above it follows that the period of the output signals is a fixed multiple of the frequency of the signal FCT so that with the aid of the frequency of the signal FCT the speed of the motor can be controlled. Via the device 15 (FIG. 3) the frequency of the generated carrier wave is also locked to the frequency of the signal FCT. The frequency of the carrier wave, however, determines the frequency with which the switches 3 through 7 (FIG. 1) are switched. In order to enable the switching frequency to be filtered out effectively by the motor impedance, said frequency should for example be at least 660 Hz, and because power switches such as thyristors have a maximum switching frequency, this switching frequency should not exceed for example 1000 Hz, so that the frequency of the carrier wave should for example lie between 600 Hz and 1000 Hz. Conversely, the motor speed must be variable between for example 0.1 Hz and 60 Hz so that a fixed coupling between the frequency of the signal FCT and the frequency of the carrier wave (determined by the frequency of said start pulses) is not possible. Variable dividers will have to be included so that the ratio between the carrier frequency and the frequency of the FCT signal is variable in steps. In a realized embodiment the frequency ratios in the table of FIG. 11 have been selected. In this table the first column is an indication of the frequency ratio P ($P_1$ through $P_8$), the second column the frequency $f_o$ of the "sinewave" which is modulated in the output signal, the third column the corresponding carrier frequency $f_c$, and the fourth column the ratio $f_c/f_o$ of the two frequencies.

From the selected frequency ratios it appears that the ratio of the period of the output signal and the period of the carrier wave is odd for the two smallest ratios, which appears to be advantageous in respect of harmonic distortion. Moreover, the frequency ranges of the output signal are found to overlap partially for the different frequency ratios, which gives rise to hysteresis so that oscillations between adjacent frequency ratios cannot arise.

A method of realizing the different frequency ratios $P_1$ through $P_8$ is explained with reference to FIG. 12.

This Figure shows a device which is an extension of a combination of the devices of FIGS. 3 and 8.

The signal FCT is applied to a divider 25 which divides by 14 or 10 under control of a control element 31. Via point 26 the output signal of this divider is applied to a two-divider 28, whose output signal is applied to a two-divider 29 via point 27. The output signal of said two-divider 29 is applied to a two-divider 32 via point 33, the output signal of said divider 32 being applied to the counter 19 via point 9. The counter 19 now counts to 5 or 7 under control of the control element 31 in such a way that the dividend is 5 or 7 if the dividend of the divider 25 or 14 or 10 respectively. Thus, the overall dividend of the chain 25, 28, 29, 32, 19 is constant. The counter 19 is followed by the six-counter 20.

From the points 26, 27, 33 and 9 signals are applied to a selection device 30, which in conjunction with two dividers 28, 29, and 32 constitutes the device 15 for generating the start and set pulses for the up/down counter 16. This selection device 30 selects those pulses as start pulses which are in synchronism with one of the signals at points 26, 27, 33 or 9, under control of the control element 31. This means that the repetition of the start pulses is 8, 4, 2 or 1 times the frequency of the input signal of the counter 19.

Between the up/down counter 16, specifically a 16-counter, and the source which supplies the signal VCT an up/down counter 34 is included which counts up and down to 8, 4, 2 or 1 under control of the control element 31. By means of this controllable counter 34 the length of one counting cycle of the combination up/down counter 34 and up/down counter 16 can be increased by a factor of 2, 4 or 8.

The control element 31 should control the various counters in such a way that the counter 25 divides by 14 for the frequency ratios $P_2$, $P_4$, $P_6$ and $P_8$ and by 10 for the frequency ratios $P_1$, $P_3$, $P_5$ and $P_7$. The counter 19 should count to 5 for the frequency ratios $P_2$, $P_4$, $P_6$ and $P_8$ and to 7 for the frequency ratios $P_1$, $P_3$, $P_5$ and $P_7$. The device 30 should generate the start pulses in synchronism with the signal at the points 26, 27, 33 and 9 for the frequency ratios $P_1$ and $P_2$, $P_3$ and $P_4$, $P_5$ and $P_6$, and $P_7$ and $P_8$ respectively.

If the control element 31 realizes the afore-mentioned control process, the various frequencies will be as indicated in the table of FIG. 13. In this table the first column gives the various frequency ratios $P_1$ through $P_8$, the second column the frequency $f_1$ of the signal at point 26 related to the frequency $f_f$ of the signal FCT, the third column the frequency $f_s$ of the start pulses, the fourth column the frequency $f_c$ of the carrier wave, which is half the frequency of the start pulses (FIG. 4), and the fifth column the frequency $f_o$ of the "sinewave". From the table it follows that the ratio $f_c/f_o$ is as indicated in the table of FIG. 11.

In the description with reference to FIGS. 7, 8, 9 and 10 it has been assumed that the counter 19 is a five-counter. In the device of FIG. 12 said counter 19 is a five-counter or a seven-counter, so that five or seven positions are obtained per 60° sector (see FIG. 7). If the counter 19 is a five-counter, the device 17 should comply with the function represented in FIG. 10 and if this counter 19 is a seven-counter, it should comply with a similar function but with 7 positions of the counter 19. The various widths of the modulation pulses should then be in accordance with the table of FIG. 9, for example as indicated in the table of FIG. 14, in which the first column gives the count of the counter 19 and the second, third and fourth columns the relative widths of the required modulation pulses for the 60° sectors I, II and III. Consequently, the device 18 should not only generate the modulation pulses with relative widths as indicated in the table of FIG. 9, but also with the relative widths 2, 4, 7, 9 and 10, i.e. 12 different relative widths in total.

The device should generate pulse-width modulated signals in such a way that the motor flux remains substantially constant. For this purpose the integral of all modulation pulses should be constant for one period of the output signal, i.e. the "sinewave", so that this integral increases with the output frequency. For each frequency ratio P this is achieved in that the widths of the modulation pulses are independent of the frequency $f_c$ of the carrier wave. However, when the frequency ratio P changes the frequency $f_c$ of the carrier wave changes stepwise, so that it is necessary to adapt the widths of the modulation pulses. At transitions between two adjacent frequency ratios P, for example from $P_1$ to $P_2$, for which the counter 19 is switched from operation as a seven-counter to operation as a five-counter, this is effected automatically in that the device 21 starts modulating in accordance with the table of FIG. 14 instead of in accordance with the table of FIG. 9. Thus the relative width of the modulation pulse at the peak of the "sinewave" changes from 14 to 10, which is a ratio of 7:5. At transitions between the groups of frequency ratios ($P_1$, $P_2$), ($P_3$, $P_4$), ($P_5$, $P_6$) and ($P_7$, $P_8$) the counting range S of the counter 34 is changed as indicated in the sixth column of the table of FIG. 13 upon a command of the control element 31. Upon a change from for example the frequency ratio $P_3$ to the frequency ratio $P_1$ the frequency $f_c$ of the carrier wave is suddenly doubled so that the number of modulation pulses per period of the "sinewave" is also doubled. However, the width of the modulation pulses is halved in that the counter 34 is switched from counting range 2 to counting range 1, so that the requirement is met that said integral must be constant.

For the frequency ratio $P_8$ the ratio $f_c/f_o$ equals 15. As for this frequency ratio 5 positions are counted per 60° sector, the number of edges of the carrier wave per position equals one.

For the frequency ratio $P_7$ this is also the case. For the other frequency ratios $P_6$ through $P_1$ the frequency $f_o$ is 2, 4 or 8-fold of the frequency $f_o$ at the frequency ratios $P_8$ and $P_7$, so that the number of edges of the carrier wave per position is 2, 2, 4, 4, 8 and 8 for the frequency ratios $P_6$, $P_5$, $P_4$, $P_3$, $P_2$ and $P_1$ respectively. Thus, for each position always 1, 2, 4 or 8 edges of the carrier wave should be modulated with the same modulation pulse w.

FIG. 15 shows a block diagram of the control element 31. This control element 31 comprises a device 35 for generating a measuring pulse with a duration of a number of pulses of the signal FCT, for example 28. The device 35 may be combined with one or more devices 25, 28, 29 or 32. Via a connection 36 this measuring pulse is applied to a counter 38, for example a 64-counter, which counter counts for the duration of the measuring pulse. To the input of this counter 38 a reference clock signal RCT is applied of a suitably selected frequency. The count of the counter at the end of a measuring period is applied to a device 39. In the case of a 64-counter this count is a 6-bit code. The device 35 also generates reset pulses which via the connection 37 are applied to the counter 38 so as to prepare this counter 38 for a subsequent measuring period.

The device 39 controls a memory 40 depending on the count of the counter after each measuring period, the contents of the memory 40 being fed back to the device 39. The contents of the memory 40 appears at four outputs in the form of a binary code $X_1$, $X_2$, $X_3$, $X_4$ which is a suitable indication of the frequency ratio P.

The function of the device 31 is explained with the aid of a table shown in FIG. 16. In this table the first column represents the various frequency ratios P and the second and the third column various final counts of the counter 38 after one measuring period, for which final counts the state of the memory 40 should change. The second column gives these counts which correspond to a specific frequency ratio P when the frequency of the signal FCT increases, and the third column when said frequency decreases. Owing to the overlap of the various ranges in the second and the third column the desired hysteresis is obtained. The frequency of the signal RCT should then be selected so that the range of the counter 38 (counts 1 through 64) corresponds to the frequency range of the signal FCT. The various frequency ratios $P_1$ through $P_8$ then meet the requirement represented by the table of FIG. 11. A high count, for example 64, then corresponds to a low frequency of the signal FCT and a low count to a high frequency of the signal FCT.

The chage-over to other frequency ratios P is explained with the aid of the graph of FIG. 17. On the horizontal axis the possible final counts of the counter 38 after a specific measuring period are plotted and on the vertical axis the frequency ratios $P_1$ through $P_8$.

If the frequency of the signal FCT is very low the counter 38 always counts to 64. It is assumed that the state of the memory 40 then corresponds to the frequency ratio $P_1$ and if the frequency is increased, then at the instant that the final count of the counter 38 becomes 56 after a specific counting period the state of the memory will change to a state corresponding the frequency ratio $P_2$, in accordance with the second column of the table of FIG. 16. Similarly, the state of the memory will consecutively be changed to a state which corresponds to the frequency ratios $P_3$, $P_4$, $P_5$, $P_6$, $P_7$ and $P_8$ when, in this order, the final count of the counter 38 becomes 40, 28, 20, 14, 10 and 7 respectively after a specific measuring period. The counts which are given in the third column of the table of FIG. 16 then do not play a part because the state of the memory then does not correspond to the frequency ratios given in the first column.

When subsequently the frequency decreases again, the complete cycle is repeated in the reverse sequence, the state of the memory being changed at the counts given in the third column of the table of FIG. 16. The counts which are given in the second column then do not play a part because the state of the memory for these counts then does not correspond to the frequency ratios given in the first column.

In this way a hysteresis is obtained so that for each frequency of the signal FCT the frequency ratio P is uniquely determined.

The state of the memory 40 is represented by a four-bit code $X_1$, $X_2$, $X_3$ and $X_4$. In a practical embodiment a code as indicated in the table of FIG. 18 has been selected. In this table the first colunm gives the frequency ratios $P_1$ through $P_8$ and the second, third, fourth and fifth columns the signals $X_1$, $X_2$, $X_3$ and $X_4$ respectively.

If the table of FIG. 18 is compared with the table of FIG. 13 it will be noted that the signal $X_4$ with the level "0" indicates that the counter 25 is a 10-counter and with the level "1" that the counter 25 is a 14-counter, i.e. whether seven or five positions are selected per 60° of the "sinewave". Thus, the control element 31 controls the devices 25, 19 and 21 (FIG. 12) with the signal $X_4$. With the signals $X_1$, $X_2$ and $X_3$ the devices 34 and 30 are then controlled.

The circuit details of the arrangement in accordance with the invention of FIG. 12 will be discussed in more detail with reference to FIGS. 19 et seq.

FIG. 19 shows the circuit arrangement of the divider 25, which can be switched to operate as a divide-by-fourteen or a divide-by-ten circuit. Of the logic gates reference numeral 43 represents an inverter, 44 a NOR-gate, 45 an AND-gate, and 46 an OR-gate. The symbol 42 is a flip-flop with a clock input T, a set input S and a reset input R. Furthermore this flip-flop has two mutually complementary outputs at which for example the signals FA and $\overline{FA}$ are available. The one output (FA) is high (logic 1) when a clock pulse appears at the clock input T after a positive voltage transient has appeared at the set input S. The other output ($\overline{FA}$) then becomes low (logic 0). After a positive voltage transient has appeared at the reset input R and a clock pulse appears at the clock input T, the one output becomes low and the other output becomes high.

The four flip-flops in FIG. 19 all receive the signal FCT as a clock signal. The first flip-flop 42 receives the signals $FC_1$ and $\overline{FC}_1$ as set and reset signals, which signals are derived from the output signals of the flip-flops 42, 47 and 48 and the signal $X_4$ from the control element 31 with the aid of a logic gate circuit. The set and reset inputs of the flip-flop 47 receive the output signals FA and $\overline{FA}$ from the flip-flop 42 and the set and reset inputs of the flip-flop 48 receive the output signals FB and $\overline{FB}$ from the flip-flop 47. The flip-flop 49 receives the signals $FC_2$ and $\overline{FC}_2$ as set and reset signals, which signals are derived from output signals of the flip-flops 42, 47 and 49 via a gate circuit. The output signal FD of the flip-flop 49 constitutes the output signal of the divider 25.

The time diagram of FIG. 20 shows various signals which may appear in the circuit of FIG. 19. FIG. 20a shows the signal FCT, FIG. 20b the signals FA, FB, FC, FD, $FC_1$ and $FC_2$ in the case that the signal $X_4$ has a value 1, and FIG. 20c shows these signals for $X_4=0$.

When it is assumed that at the instant $t_1$ the signals FA, FB, FC and FD have values of 0, 0, 1 and 0 respectively, the gate circuits will realize the value 1 for the signals $FC_1$ and $FC_2$. Upon the occurrence of the next clock pulse (FCT) at the instant $t_2$ the output of flip-flop 42 will assume the value of the signal at the input, i.e. the signal FA then becomes high (=1). Moreover, the signal FD becomes high. The flip-flop 47 transfers this value of FA to FB upon the occurrence of the next clock pulse. Each time that the level of one of the signals FA, FB, FC and FD changes, the levels of the signals $FC_1$ and $FC_2$ can change. Thus, the signal waveforms of FIG. 20 are obtained.

For $X_4=1$ it appears that at the instant $t_5$, i.e. 14 pulses of the signal FCT after the instant $t_1$, the various signals have the same values as at the instant $t_1$, so that the complete cycle is repeated. The signal FD then has a repetition frequency which is 1/14 of the repetition frequency of the signal FCT so that the circuit constitutes a divide-by-fourteen circuit.

For $X_4=0$ it is found that at the instant $t_4$, which is 10 pulses of the signal FCT after the instant $t_1$, the various signals have the same value as at the instant $t_1$, so that the entire cycle is repeated. The signal FD then has a repetition frequency which is 1/10 of the repetition frequency of the signal FCT so that the circuit is a divide-by-ten circuit.

FIG. 21 shows a circuit for processing the output signal FD of the device 25. In this device the signal FD is synchronized with the signal VCT and the signals $FC_3$ and $FC_4$ for the device 15 are derived therefrom. The logic gate 50 represents a NAND-gate.

The circuit includes two series-connected flip-flops 51 and 52. The two flip-flops receive the signal VCT as clock signal.

FIG. 22 shows a time diagram with various signals which appear in the device of FIG. 21 for $X_3=1$. Synchronization is achieved in that the signal FE cannot assume the value of the signal FD until a clock pulse has been supplied to the input T of flip-flop 51. If the level of the signal FD changes, for example after the instant $t_1$ at which a pulse of the signal VCT appears, the level of the signal FE will change after the next VCT pulse, i.e. after the instant $t_2$. Subsequently, the level of the signal FF changes after the instant $t_3$. By means of the NOR-gate 53 the signal $FC_3$ is formed, which signal has the value 1 if the signal FE has the value 0 and at the same time the signal FF has the value 1. Consequently, this signal $FC_3$ is a signal with a repetition frequency equal to that of the signal FD but with a pulse width equal to the spacing between two consecutive VCT pulses. In a similar way the signal $FC_4$ is formed, which is the inverse of the signal $FC_3$ but 180° shifted. For $X_3=0$ the signal $FC_4$ always has the logic value 1.

The signals $FC_3$ and $FC_4$ and the signals $X_1$, $X_2$ and $X_3$, which are obtained from the control element 31, are supplied to a device 15. This device 15 is shown in more detail in FIG. 23. This device 15 comprises three flip-flops 54, 55 and 56. Flip-flop 54 is a flip-flop without set and reset inputs. The state of the output signals (FG and $\overline{FG}$) changes each time that a clock pulse ($FC_3$) is applied to the input T. The flip-flops 55 and 56 also receive the signal $FC_3$ at their clock inputs. Set and reset pulses for the flip-flops 55 and 56 are derived from the output signals of the flip-flops 54, 55 and 56 (which are the signals FG, FH and FI and the inverted forms thereof) in a similar way as for the divider 25 (FIG. 19), in order to obtain the correct signals Fg, FH and FI. From these signals FG, FH and FI and the signal $FC_3$ the signal $FC_{11}$ is derived with the aid of an AND-gate. The signal $FC_{11}$ serves an input signal for the counter 19.

If the three flip-flops are interconnected via gates as shown in FIG. 23, the signals FG, FH, FI and $FC_{11}$ will be as shown in the time diagram of FIG. 24. This time diagram also shows the set signals $FC_5$ and $FC_6$ for the flip-flops 55 and 56 respectively. The signal $FC_{11}$ is a pulse train with a frequency which is ⅛ of the frequency of the signal $FC_3$.

The device 15 of FIG. 23 furthermore comprises a device 57 for generating signals $FC_7$, $FC_8$, $FC_9$ and $FC_{10}$ as a function of the signals FG, FH, FI, $FC_3$, $FC_4$, $X_1$, $X_2$ and $X_3$.

In respect of the signals $FC_7$ and $FC_8$ the device 57 realizes the functions represented by the table of FIG. 25. These functions can all be realized by means of logic gates in accordance with known techniques. By way of illustration FIG. 26 shows how the function is realized for the signal $FC_7$.

If the signals $FC_7$ and $FC_8$ for the various signals $X_1$, $X_2$, $X_3$ of the control element 31 are generated in accordance with the functions of the table of FIG. 25, these signals will be as shown in the time diagram of FIG. 24, in which the signals $FC_7$ and $FC_8$ in this order and from top to bottom correspond to ($X_1=0$, $X_2=0$, $X_3=0$), ($X_1=1$, $X_2=0$, $X_3=0$), ($X_1=1$, $X_2=1$, $X_3=0$) and ($X_1=1$, $X_2=1$, $X_3=1$). Thus, depending on $X_1$, $X_2$ and $X_3$, the signal $FC_7$ has a frequency which is ⅛, ¼, ½ or 1/1 of the frequency of the signal $FC_3$, and the signal $FC_8$ is always the same as the signal $FC_7$ but shifted through 180°. These signals $FC_7$ and $FC_8$ constitute the start and set pulse trains for the up/down counter 16.

The device 57 furthermore realizes the signals $FC_9$ and $FC_{10}$. The signal $FC_{10}$ is realized in accordance with the function $FC_{10}=FG.FH.\overline{FI}$, which can be effected with an AND-gate to whose inputs the signals, FG, FH and $\overline{FI}$ are applied. This signal $FC_{10}$ is shown in the time diagram of FIG. 24.

The signal $FC_9$ is realized with a NAND-gate to which the signal $\overline{FH}$ and FI is applied:

$$FC_9 = \overline{FH} + FI.$$

This signal is shown in FIG. 24.

The signal $FC_9$ is applied to the control element 31 and determines the period in which the counter 38 counts the pulses of the reference signal RCT (see FIG. 15). The signal $FC_{10}$ then serves as reset pulse train for the counter 38. This signal $FC_9$ appears to be low for two periods of the signal $FC_3$, or for 28 periods of the signal FCT for $X_4=1$, and for 20 periods of the signal FCT for $X_4=0$.

FIG. 27 shows an embodiment of the up/down counter 34. This counter 34 comprises three flip-flops 58, 59 and 60, each having a clock input T and outputs at which the signals VA, VB and VC respectively and the corresponding inverted signals appear. Furthermore, these flip-flops have inputs at which the signals $VC_4$ and $\overline{VC_4}$ are present. For $VC_4=0$ these flip-flops operate normally, i.e. their output levels change upon the occurrence of a clock pulse at their clock inputs. IF $VC_4=1$, the outputs VA, VB and VC become high (=1).

To the clock input T of flip-flop 58 a signal $VC_1$ is applied which via a gate circuit 62 has been derived from the signal VCT. This gate circuit 62 either transfers or blocks the signal VCT.

The outputs of the flip-flops 58 and 59 are connected to the clock inputs of the flip-flops 59 and 60 via a gate circuit 61. To this gate circuit the signals $X_1$ and $X_2$ from the control element 31 and a signal $VC_5$ are applied. This signal $VC_5$ determines the counting direction. For $VC_5=1$ the counter counts up and for $VC_5=0$ it counts down. This gate circuit 61 supplies the clock signals $VC_2$ and $VC_3$ for the flip-flops 59 and 60.

The outputs of the three flip-flops 58, 59 and 60 are interconnected via a gate circuit 63. This gate circuit produces a signal $VC_6$ which constitutes the input signal for the up/down counter 16. Furthermore, the signals $X_3$, $VC_5$ and $VC_1$ are applied to this gate circuit 63.

The gate circuit 61 performs the following two logic functions:

$$VC_2 = (VA \cdot VC_5 + \overline{VA} \cdot \overline{VC_5} + X_1) \cdot VC_1$$

$$VC_3 = (VA \cdot VC_5 + \overline{VA} \cdot \overline{VC_5} + X_1) \cdot (VB \cdot VC_5 + \overline{VB} \cdot \overline{VC_5} + X_2) \cdot VC_1$$

These functions can be realized with known logic techniques by means of logic gates in a similar way to the gate circuit of FIG. 26.

A better understanding of said two functions can be obtained with the aid of the table of FIG. 27a in which these functions are represented for different values of $X_1$, $X_2$ and $VC_5$. For $VC_5$, $X_1$, $X_2=1$, 0, 0, the signal $VC_2$ is $VA \cdot VC_1$, so that the signal $V_B$ will be a square-wave with a frequency equal to half the frequency of the signal VA, which signal VA has a frequency equal to half the repetition frequency of the signal $VC_1$. The signal $VC_3$ is then $VA \cdot VB \cdot VC_1$, so that the signal VC has a frequency which is ¼ of the frequency of the signal $V_A$. In this case the counter is an 8-counter. For $VC_5$, $X_1$, $X_2=0$, 0, 0, the signals $VC_2$ and $VC_3$ will become $\overline{VA} \cdot VC_1$ and $\overline{VA} \cdot \overline{VB} \cdot VC_1$ respectively, so that in this case the counter is an 8-counter which counts in the reverse direction. For $X_1$, $X_2=1$, 0, the signal $VC_2$ equals $VC_1$ so that the signal VB is identical to VA. For $X_1$, $X_2=1$, 0 the signal $VC_3$ is $VB \cdot VC_1$ or $\overline{VB} \cdot VC_1$ and because in this case VB=VA is identical to the signal $VC_2$ for $X_1$, $X_2=0$, 0 so that for $X_1$, $X_3=1$, 0 the signal VC is identical to the signal VB for $X_1$, $X_2=0$, 0. For $X_1$, $X_2=1$, 1 the signals VB and VC are identical to the signal VA.

The various signals VA, VB and VC which are possible have been plotted in the time diagram of FIG. 28, in which the left-hand part applies to $VC_5=1$ and the right-hand part to $VC_5=0$. The signal VB' is the signal VB for $X_1$, $X_2=0$, 0 and the signal VC' is the signal VC for $X_1$, $X_2=0$, 0.

For ($X_1$, $X_2=0$, 0), ($X_1$, $X_2=1$, 0) and ($X_1$, $X_2=1$, 1) the signal VC is identical to VC', VB' and VA respectively, so that the counter 34 constitutes an 8, 4 or 2-counter which can count in both directions. The counter 34 functions as a 1-counter if the signal $VC_1$ is selected as the output signal (this is effected in the gate circuit 63).

The gate circuit (63 performs the following logic function:

$$VC_6 = (VA \cdot VC_5 + \overline{VA} \cdot \overline{VC_5} + X_1) \cdot (\overline{VB} \cdot \overline{VC_5} + VB \cdot VC_5 + X_2) \cdot (\overline{VC} \cdot \overline{VC_5} + VC \cdot VC_5 + X_3) \cdot VC_1$$

This signal $VC_6$ is shown in the time diagram of FIG. 28, where $VC_6'$, $VC_6''$, $VC_6'''$ and $VC_6''''$ represent the signal $VC_6$ for $X_1$, $X_2$, $X_3=(0, 0, 0)$, $(1, 0, 0)$, $(1, 1, 0)$ and )1, 1, 1) respectively. The left-hand part again applies to $VC_5=1$ and the right-hand part to $VC_5=0$. When considering the time diagrams it will be noted that the pulses $VC_1$ are comparatively short and that the levels of the outputs of the various flip-flops change with a delay relative to the clock pulse. The signal $VC_6'$ for example should assume the logic value 1 if VA and VB' and VC' have the logic value 1 and in the presence of a pulse of the signal $VC_1$. After the appearance of this pulse of $VC_1$, which is designated A in the diagram, VA, VB' and VC' have assumed the value 1 but the pulse of $VC_6'$ will not appear until the next pulse B of the signal $VC_1$.

FIG. 29 shows the circuit arrangement of the up/down counter 16. This counter comprises 4 flip-flops 64, 65, 66 and 67. In a similar way as with the counter of FIG. 27 the signal $VC_4$ is applied to these flip-flops in order to enable the value 1 to be impressed on the output signals VD, VE, VF and VG of the flip-flops 64, 65, 66 and 67 respectively, independently of the set and the reset signal. The flip-flop 64 receives the signal $VC_6$ from the counter 34 as a clock signal. The clock signals $VC_7$, $VC_8$ and $VC_9$ for the flip-flops 65, 66 and 67 respectively are derived from the output signals VD, $\overline{VD}$, VE, $\overline{VE}$, VF and $\overline{VF}$ of the flip-flops 65, 66 and 67 via a gate circuit 68. Moveover, the signal $VC_6$ and the signal $VC_5$, which defines the counting direction, are applied to this gate circuit 68. The gate circuit 68 performs the following functions:

$$VC_7 = (VC_5 \cdot VD + \overline{VC_5} \cdot \overline{VD}) \cdot VC_6$$

$$VC_8 = (VC_5 \cdot VD + \overline{VC_5} \cdot \overline{VD}) \cdot (VC_5 \cdot VE + \overline{VC_5} \cdot \overline{VE}) \cdot VC_6$$

$$VC_9 = (VC_5 \cdot VD + \overline{VC_5} \cdot \overline{VD}) \cdot (VC_5 \cdot VE + \overline{VC_5} \cdot \overline{VE}) \cdot (VC_5 \cdot VF + \overline{VC_5} \cdot \overline{VF}) \cdot VC_6$$

These functions are similar to those performed by the gate circuit 61. They can also be realized in a simple manner using logic gates in accordance with known techniques.

The output signals VD, VE, VF and VG of the flip-flops 64, 65, 66 and 67 are shown in the time diagram of FIG. 30. This time diagram also shows the signals $VC_5$ and $VC_6$. This signal is assumed to appear after the instant $t_1$, at which instant the following applies to the count VD, VE, VF, VG = 0, 0, 0, 0. The counter counts until the count (VD, VE, VF, VG) is 1, 1, 1, 1. Subsequently the signal $VC_5$ becomes 0 and the counter counts in the reverse direction until the counter has again become 0, 0, 0, 0. In the gate circuit 62 (FIG. 27) the signal VCT is then suppressed until a new start pulse appears (line 12 in FIG. 12). Thus, all 16 counts are passed in both directions. For the signal $VC_6$ in the time diagram the counts are numbered in accordance with the numbering of the counts in FIG. 6e, in which the output signal of the counter 16 is represented symbolically.

The count (VD, VE, VF, VG) is applied to the gate circuit 18 which generates the modulation pulses W.

The various pulse widths W can simply be realized by detecting the various counts by means of gate circuits. The relative modulation pulse widths are given in the tables of FIGS. 9 and 14. As absolute widths a number of counting steps of the counter 16 has been selected which equal twice the relative width.

It is then not necessary to generate all the pulse widths W. By also applying the signal $X_4$ to the gate circuit 18, the tables of FIGS. 9 and 14 can be combined so that eight outputs are obtained which are the outputs carrying the signals $VC_{20}$ through $VC_{27}$. For $X_4 = 0$ these signals $VC_{20}$ through $VC_{27}$ are the modulation pulses $W_2$, $W_3$, $W_4$, $W_6$, $W_7$, $W_8$, $W_9$ and $W_{10}$ respectively and for $X_4 = 1$ these signals are the modulation pulses $W_2$, $W_3$, $W_6$, $W_7$, $W_{11}$, $W_8$, $W_{12}$ and $W_{14}$ respectively.

To illustrate this FIG. 31 shows a part of this gate circuit which generates the signal $VC_{22}$. In this circuit the signals $\overline{X_4}$ and $\overline{VE}$ are applied to an OR-gate whose output signal together with a signal $\overline{VF}$ is applied to an AND-gate. The output signal of this AND-gate together with a signal $\overline{VG}$ is applied to a NOR-gate, whose output signal is the signal $VC_{22}$ for which the following is valid:

$$VC_{22} = (X_4 \cdot VE + VF) \cdot VG.$$

For $X_4 = 0$ this signal is the modulation pulse $W_4$ and for $X_4 = 1$ it is the modulation pulse $W_6$. These modulation pulses $W_4$ and $W_6$ are included in the time diagram of FIG. 30.

FIG. 31a shows a function table for the signals $VC_{20}$ through $VC_{27}$, which functions are to be realized with the aid of gate circuit 18. These functions can all be performed with known techniques in accordance with the gate circuit of FIG. 31.

FIG. 32 shows the circuit for generating the signal $VC_5$ which determines the counting direction of the counters 34 and 16. The circuit includes a flip-flop 69. To the clock input T the signal VCT is applied. The outputs of the flip-flop provide the signals $VC_5$ and $\overline{VC_5}$ via inverters. The signals VA, VB and VC, which are the three bits from the counter 34, are applied to a NAND-gate 71, and the four bits VD, VE, VF and VG from the counter 16 are applied to a NAND-gate 72. The output signal $VC_{11}$ of the NAND-gate 71 and the output signal $VC_{12}$ of the NAND-gate 72 are applied to a NAND-gate 74 via an OR-gate 73 together with the signal $VC_5$. The output signal $VC_{10}$ of said NAND-gate 74 constitutes the set signal for the flip-flop 69 and the inverse of the signal $VC_{10}$ constitutes the reset signal.

The flip-flop 69 can set the flip-flop to a specific state with the aid of a signal $VC_{13}$. If $VC_{13}$ has the value "0", the one output also has this value and the signal $VC_5$ has the value 1. The signal $VC_{13}$ is the output signal of a NAND-gate 70 to which the signal VCT and the signal $FC_7$, which are the start pulses supplied by the device 15, are applied.

Assume that at a specific instant the counters 34 and 16 are at zero (VA through VG = 0) and that $VC_5$ has the value 0. In that case $VC_{11}$ and $VC_{12}$ are 1 and $VC_{10}$ is 1, i.e. the set input S is high, which corresponds to $VC_5 = 0$. If a start pulse $FC_7 = 1$ appears at the gate 70, $VC_{13}$ becomes low at the instant that the pulse signal VCT appears, so that $VC_5$ becomes high and the counters 34 and 16 are switched to the count-up mode. When the two counters 34 and 16 reach their final count, i.e. when the signals VA through VG are all 1, the signals $VC_{11}$ and $VC_{12}$ become low and $VC_{10}$ becomes high. Upon the next pulse of the signal VCT at the clock input T $VC_5$ becomes low ($VC_5 = 0$) so that the output of gate 74 remains high regardless of the further counts, and the counters 34 and 16 are switched to the count-down mode. The count-down cycle then commences after the next pulse of the signal VCT.

FIG. 33 shows a circuit for generating the signal $VC_4$ which serves to set the counters 34 and 16 to the final count (VA through VG = 1) when a set pulse $FC_8$ appears while $VC_5$ is high (see description with reference to FIGS. 6d and 6e). For this purpose the signals $FC_8$ and $VC_5$ are applied to a NAND-gate 75 whose output supplies the signal $VC_4$ via an inverter 76. This signal $VC_4$ is high when a set pulse $FC_8$ appears while $VC_5$ is high, or when the counters 34 and 16 are in the count-up mode.

FIG. 34 shows the circuit 62 (FIG. 27) for generating the signal $VC_1$. This signal $VC_1$ is taken from the output of a NAND-gate 77 via an inverter 78, to which NAND-gate 77 the signal VCT and signals $VC_{15}$, $VC_{16}$ and $VC_{17}$ are applied. Consequently, the signal $VC_1$ is the signal VCT if the signals $VC_{15}$, $VC_{16}$ and $VC_{17}$ have the value 1.

The signal $VC_{15}$ is taken from a NOR-gate 80 via an inverter 79, to which NOR-gate 80 the signals $VC_{11}$ and $VC_{12}$ are applied, which signals are obtained from the circuit of FIG. 32. In addition the signal $\overline{VC_5}$ is applied to this gate 80. The signal $VC_{15}$ is then low ($VC_{15}=0$) if VA through VG have the value 1 and the signal $VC_5$ has the value 1. The signal VCT is then not transferred by the gate 77. This means that the first pulse of the signal VCT which appears after the counters 34 and 16 have reached their final counts in the count-up mode is suppressed which, as previously stated, is a desired property.

In this respect it is to be noted that the output signal $VC_{14}$ of gate 80 becomes high if $VC_5$ becomes low, while the counters 34 and 16 have reached their final counts i.e. at the instant $t_4$ in the time diagram of FIG. 4, so that this signal $VC_{14}$ may serve as trigger signal for the device 16 which generates the carrier wave.

The signal $VC_{16}$ is taken from the output of NAND gate 81 to which the signals $VC_{18}$ and $VC_{19}$ are applied. $VC_{16}$ is low when both $VC_{18}$ and $VC_{19}$ are high. The signal $VC_{18}$ is taken from a NOR-gate 82 to which the signals VA, VB and VC are applied and the signal $VC_{19}$ is taken from a NOR-gate 83 to which the signals VD, VE, VF, VG and $VC_5$ are applied. As a result, the signal $VC_{16}$ is low when the signals VA through VG and the signal $VC_5$ are low, i.e. when the counters 34 and 16 have counted down to zero (VA through VG=0). Thus, the signal VCT is suppressed by the gate 77 after the end of a counting cycle.

The signal $VC_{17}$ is the output signal of the inverter 84 to which the start pulses $FC_7$ are applied. As a result, the signal VCT is suppressed by gate 77 during the appearance of a start pulse $FC_7$. Thus it the counters cannot start their counting cycle with the first count (VA, VB, VC=1, 0, 0 and VD, VE, VF, VG=0, 0, 0, 0).

FIG. 35 shows the circuit arrangement of the counter 19. This counter comprises three flip-flops 85, 86 and 87, to which flip-flops the signal $FC_{11}$ (see FIG. 23) is applied as a clock signal. The outputs of the flip-flops 85, 86 and 87 carry the signals FJ, FK and FL respectively and the corresponding inverted signals ($\overline{FJ}$, $\overline{FK}$ and $\overline{FL}$). The set and reset inputs S and R of flip-flop 87 receive the signals FK and $\overline{FK}$. The set and reset inputs S and R of the flip-flops 85 and 86 receive the signals $FC_{12}$ and $FC_{13}$ and the corresponding inverted signals from a gate circuit 88, to which gate circuit 88 the signals FJ, FK, FL, $\overline{FJ}$, $\overline{FK}$, $\overline{FL}$ and the signal $X_4$ are applied.

The gate circuit performs the following functions:

$$FC_{12}=FJ\cdot\overline{FL}\cdot\overline{X_4}+(\overline{FK}+FL)\cdot\overline{FJ}$$

$$FC_{13}=(\overline{X_4}+FK)\cdot\overline{FJ}$$

These functions can be realized in a similar way as for example the functions required for the counter 25 (FIG. 19). The operation of the counter 19 corresponds to the operation of counter 25 and the counter 19 constitutes a five-counter for $X_4=1$ and a seven-counter for $X_4=0$.

The counts of the counter 19 are expressed as a combination of the signals FJ, FK and FL in the table of FIG. 36. In this table the first column gives the value of $X_4$, the second column a numbering of the counts, and the third, fourth and fifth columns the values of the signals FJ, FK and FL respectively.

The counter 19 and the six-counter 20 control the gate circuit 21 which in the appropriate manner adds the various modulation pulses W to the carrier wave C. For $X_4=1$ this gate circuit 21 should perform the functions given in the table of FIG. 10. For $X_4=0$ a similar set of functions must be performed. When considering FIG. 10 it is found that three trains of modulation pulses appear at regular intervals as a function of the count of the counter 19. For $X_4=1$ these are the pulse trains (O, $W_3$, $W_6$, $W_8$, $W_{11}$), ($W_{12}$, $W_{14}$, $W_{14}$, $W_{14}$, $W_{14}$), and ($W_{12}$, $W_{11}$, $W_8$, $W_6$, $W_3$) and for $X_4=0$ (with the aid of FIG. 14) the pulse trains (O, $W_2$, $W_3$, $W_4$, $W_6$, $W_7$, $W_8$), ($W_9$, $W_9$, $W_{10}$, $W_{10}$, $W_{10}$, $W_{10}$, $W_9$) and ($W_9$, $W_8$, $W_7$, $W_6$, $W_4$, $W_3$, $W_2$).

FIGS. 37a, 37b and 37c show gate circuits for realizing these pulse trains as a function of the count of the counter 19. To these gate circuits the output signals FJ, FK, FL, $\overline{FJ}$, $\overline{FK}$ and $\overline{FL}$ of the counter 19 and the signals $VC_{20}$ through $VC_{27}$ from the gate circuit 18 (FIG. 29) are applied. The signals $VC_{20}$ through $VC_{27}$ are the various modulation pulses W. The circuits of FIGS. 37a, 37b and 37c also realize a part of the functions $VC_{21}$ and $VC_{27}$ of FIG. 31a. $VC_{21}$ comprises the signal $VC_{20}$. In the circuit of FIG. 37a the signal $VC_{20}$ is added to the signal $VC_{21}$ via the gates 90 and 89 and this is also the case in the circuit of FIG. 37c via the gate 91. The signal $VC_{27}$ comprises the signal $VC_{26}$. In the circuit of FIG. 37b this signal $VC_{26}$ is added to the signal $VC_{27}$ via the gate 92.

If the output signals $PC_1$, $PC_2$ and $PC_3$ of the circuits of FIGS. 37a, 37b and 37c respectively are expressed in the various pulse widths W as a function of the count of the counter 19 and as a function of the signal $X_4$, which in this respect determines the character of the signals $VC_{20}$ through $VC_{27}$ (see FIG. 31a), then the sixth, seventh and eighth columns of the table of FIG. 36 represent these signals $PC_1$, $PC_2$ and $PC_3$. The signals $PC_1$, $PC_2$ and $PC_3$ appear to be the three required modulation pulse trains. These trains should be added to the carrier wave in the correct sequence under control of the six-counter 20.

FIG. 38 shows the circuit arrangement of the six-counter 20 and a part of the gate circuit 21. The six-counter 20 consists of three flip-flops 93, 94 and 95 with the signals PB, PC and PD and the corresponding inverted signals at the outputs. The three flip-flops receive a signal $FC_{14}$ at their clock inputs T, which signal via a gate circuit 96 is derived from the output signals FJ, FK and FL of the counter 19, the clock signal $FC_{11}$ from the counter 19, and the signal $X_4$ in accordance with the following function:

$$FC_{14}=(\overline{X_4}\cdot FL+X_4\cdot\overline{FJ})\cdot\overline{FK}\cdot FC_{11}$$

This function can be realized with gates in accordance with known techniques. If the values for $X_4$, FL, FJ and FK corresponding to the various counts of the counter 19 (see FIG. 36) are inserted into this function, it is found that $FC_{14}$ is a pulse train whose pulses are in synchronism with the signal $FC_{11}$ and which appears at the end of the last count (5 or 7 respectively for $X_4=1$ and 0 respectively) of the counter 19, so that the counter 20 counts one step further each time when the counter 19 reaches its first count.

The outputs of the three flip-flops 93, 94 and 95 are connected to the set and reset inputs S and R of the flip-flop 93 via gates, as shown, so as to obtain a correct counting cycle. In the table of FIG. 39 the values of the signals FB, FC and FD which correspond to the counts in the first column are given in the second, third and fourth columns respectively.

Via gates the signals $\overline{PB}$, $\overline{PC}$ and $\overline{PD}$ are combined with each other as shown and form the signals $PC_6$, $PC_7$ and $PC_8$. The fifth, sixth and seventh columns of the table of FIG. 39 represent the signals $PC_6$, $PC_7$ and $PC_8$ respectively as a function of the count of the six-counter 20.

The table of FIG. 39 shows that for each count of the counter 20 only one of the signals $PC_6$, $PC_7$ and $PC_8$ has the value one.

The signal $PC_6$ is applied to AND-gates 99, 101 and 106, the signal $PC_7$ to AND-gates 98, 103 and 105, and the signal $PC_8$ to AND gates 100, 102 and 104. Since each time only one of the signals $PC_6$, $PC_7$ and $PC_8$ is high, only one of the three AND-gates of the groups (98, 99, 100), (101, 102, 103) and (104, 105, 106) is open for the signals $PC_1$, $PC_2$ and $PC_3$ respectively, which signals are applied to the AND-gates (98, 101, 104), (99, 102, 105) and (100, 103, 106) respectively. Per group the outputs of these AND-gates lead to a NOR-gate 107, 108 and 109 respectively, which carry the output signals $PC_9$, $PC_{10}$ and $PC_{11}$ respectively.

The eighth, ninth and tenth columns of the table of FIG. 30 represent the signals $PC_9$, $PC_{10}$ and $PC_{11}$ as a function of the count of the six-counter 20.

The signals $PC_9$, $PC_{10}$ and $PC_{11}$ consist of the signals $PC_1$, $PC_2$ and $PC_3$ which are the modulation pulse trains corresponding to the first, the second and the third 60° sector of the output signal to be formed. These three pulse trains are also necessary for the fourth, the fifth and the sixth 60° sector of the output signal to be formed. In the signals $PC_9$, $PC_{10}$ and $PC_{11}$ these three pulse trains are arranged in the correct sequence, these signals being mutually shifted by two counting steps of the six-counter 20 or 120°.

FIG. 40 shows a circuit for generating the carrier wave and for modulating said carrier wave with the signals $PC_9$, $PC_{10}$ and $PC_{11}$. The circuit includes a flip-flop 110 for generating the carrier wave. This carrier wave is the output signal PE of the flip-flop 110. The flip-flop receives the signal $VC_{14}$ (see FIG. 34) as a clock signal, which signal becomes high at the instant $t_4$ (see FIG. 4). The carrier wave edges thus coincide with the maximum counts of the counters 34 and 16. A pulse train $PC_{12}$ is supplied to the flip-flop 110 from a logic gate circuit 111. If the signal $PC_{12}$ is high, the flip-flop is always reset to PE=0. This signal $PC_{12}$ is derived from the signals $PC_4$, $PC_5$, $PC_6$ and $FC_{14}$ in accordance with the function:

$$PC_{12}=(\overline{PB}\cdot\overline{PD}+(\overline{PB}+\overline{PD})\cdot PC)\cdot FC_{14}$$

In accordance with this function the signal $PC_{12}$ consists of short pulses $FC_{14}$ (counting pulses of the six-counter 20) after every second, fourth and sixth counting step of the six counter 20. Thus it is ensured that the carrier wave PE always has the correct polarity. If, after switching on, the flip-flop 110 is in the wrong state, this flip-flop is reset to the correct state (PE=0) upon the first pulse of the signal $PC_{12}$. As the spacing between the pulses of the signal $PC_{12}$ is two counting steps of the six-counter 20 and always an even number of edges of the carrier wave PE appear during two counting steps of the six-counter 20, the signal $PC_{12}$ has no influence on the flip-flop 110 after the first reset, for after said first reset the state of the flip-flop is always low (PE=0) upon the appearance of a pulse of the signal $PC_{12}$.

The carrier wave PE is combined with the signals $\overline{PB}$, $\overline{PD}$, PC, $PC_9$, $PC_{10}$ and $PC_{11}$ to derive the signals $PC_{13}$, $PC_{14}$ and $PC_{15}$ via gates. If this is effected as indicated in FIG. 40, the following functions are realized:

$$\overline{PC_{13}}=(\overline{PC_9}+\overline{PC}+\overline{PE})\cdot(PC_9\cdot\overline{PE}+PC)$$

$$\overline{RC_{14}}=(PC_{10}+PD+\overline{PE})\cdot(PC_{10}\cdot\overline{PE}+\overline{PD})$$

$$\overline{PC_{15}}=(\overline{PC_{11}}+PB+\overline{PE})\cdot(PC_{11}\cdot\overline{PE}+PB)$$

These three signals $PC_{13}$, $PC_{14}$ and $PC_{15}$ are given in the eleventh, twelfth and thirteenth column of the table of FIG. 39 respectively and are the three pulse-width modulated carrier waves B, Y and R respectively.

FIG. 41 shows the counter 38 of the control element 31 for generating the signals $X_1$, $X_2$, $X_3$ and $X_4$ (FIG. 15). The circuit of FIG. 41 comprises a counter 112 which has a circuit arrangement similar to for example the counter 19 and is provided with a reset input R, such as for example the counter 16. The signal RCT is applied to the counting input T of the counter via an inverting gate and a NOR-gate. Furthermore, the signal $FC_9$ is applied to the NOR-gate (see FIG. 24), so that the counter 112 only receives the signal RCT if $FC_9=0$. This is during 20 pulses of the signal FCT when $X_4=0$ and during 28 pulses of the signal FCT when $X_4=1$. In order to obtain a counting cycle which is independent of $X_4$ in spite of this, the counter 112 can be switched to operate as a five-counter if $X_4=0$ and as a seven-counter if $X_4=1$. The number of output pulses per counting period of the counter 112 is consequently independent of $X_4$. Change-over is effected in a similar way as with the counters 19, 25 and 31. The counter 112 is set to zero upon receipt of the signal $FC_{10}$, which precedes a counting period (see FIG. 24).

The output signal $RC_1$ of the counter 112 is applied to the counting input T of a 64-counter 113. This counter comprises six series-connected flip-flops so that this counter counts in the binary code. The output signals RD through RI of the flip-flops are the output signals of the counter 113 and represent the count. This counter 113 is also reset upon receipt of the signal $FC_{10}$. The first count of the counter 113 corresponds to RD, RE, RF, RG, RH, RI=0, 0, 0, 0, 0, 0; the second to 0, 0, 0, 0, 0, 1 etc. up to the $64^{th}$ count which corresponds to 1, 1, 1, 1, 1, 1.

FIG. 42 shows the devices 39 and 40 of FIG. 15 in detail. The device 39 comprises a gate circuit which combines the output signals RD through RI of the counter 113 and the signal $X_4$ to derive signals $RC_2$, $RC_3$, $RC_4$ and $RC_5$.

If this is effected in the manner shown, the signals $RC_2$, $RC_3$, $RC_4$ and $RC_5$ as a function of the count will be as indicated in the diagram of FIG. 43. In this diagram A is the decimally numbered count, $RC_{20}$, $RC_{30}$, $RC_{40}$ and $RC_{50}$ the signals $RC_2$, $RC_3$, $RC_4$ and $RC_5$ for $X_4=0$, and $RC_{21}$, $RC_{31}$, $RC_{41}$ and $RC_{51}$ the signals $RC_2$ through $RC_5$ for $X_4=1$. The transitions from 0 to 1 of the various signals in FIG. 43 occur at the counts of the counter 113 given in the table of FIG. 16.

The device 40 comprises four flip-flops 114, 115, 116 and 117 with the output signals $X_4$, $X_1$, $X_2$ and $X_3$ respectively, which output signals represent a specific frequency ratio P in accordance with the table of FIG.

18. These flip-flops receive the signals $RC_2$, $RC_3$, $RC_4$ and $RC_5$ as set signals and the corresponding inverse signals as reset signals. As the trigger signal these flip-flops receive the signal $PC_{12}$ (FIG. 40), which signal is high three times during a counting cycle of the six-counter 20.

The circuit of FIG. 42 determines the frequency ratios P as symbolically represented in FIG. 17. If for example the frequency $f_f$ of the signal FCT is very low, which corresponds to the count 64 of the counter 113, the various signals will be as indicated in FIG. 43 for the count 64. After the first pulse of the signal $PC_{12}$ it is assured that $X_4=0$, $X_1=1$, $X_2=1$, and $X_3=1$. As a result, the diagrams shown in FIG. 43 for $X_4=0$ are valid. At increasing frequency $f_f$, the count A will reach the value 56 at a given instant, so that $RC_2$ becomes high. Upon the next pulse of the signal $PC_{12}$ the state of flip-flop 114 changes and $X_4=1$. Then the diagrams of $X_4=1$ are valid. If the frequency $f_f$ increases further until at a given instant the count 39 is reached, $RC_2$ and $RC_5$ become low so that after a pulse of the signal $PC_{12}$ the flip-flops 114 and 117 change over and $X_4=0$ and $X_3=0$. At a further increase of the frequency, changes occur each time at the counts included in the second column of the table of FIG. 16, and the signals $X_1$ through $X_4$ will be as shown in FIG. 18. If the frequency $f_f$ decreases, it is found that changes of the signals $RC_2$ through $RC_5$ occur only for the counts given in the third column of the table of FIG. 16.

The circuit arrangement in accordance with the invention may be extended by means of an output circuit which processes the signals $PC_{13}$, $PC_{14}$ and $PC_{15}$ further. This output circuit should generate the inverted forms thereof ($\overline{R}$, $\overline{Y}$ and $\overline{B}$) in such a way that the duration of the pulses of $\overline{R}$, $\overline{Y}$ and $\overline{B}$ is always smaller than the pulse duration of the signals R, Y and B ($PC_{13}$, $PC_{14}$ and $PC_{15}$), so as to ensure that two switches which are included in series between the supply terminals cannot be open simultaneously (FIG. 1). Furthermore, the circuit may be adapted to suppress those modulated pulses of the output signal whose duration is too short for controlling semiconductor switches.

What is claimed is:

1. A circuit arrangement for generating a load signal comprising a pulse width modulated carrier wave whose modulation depth as a function of time represents a preselected signal waveform, the circuit arrangement comprising a first counter having a count input and a start input, a first input for applying a first clock signal to the start input of the first counter so as to periodically start said counter so that the first clock signal defines a counting period of the counter, a second input for applying to the count input of the first counter a second clock signal independent of the load so that the pulses of said second clock signal are counted by the first counter, and a sequential network coupled to the counter output for consecutively detecting a sequence of preselected counts of the first counter which counts are determined by said preselected signal waveform, said sequential network generating the pulse width modulated carrier wave with a pulse width determined by the time interval between two counts of the first counter which are detected in different counting periods of said counter, the sequence in which the counts are detected being determined by said signal waveform.

2. A circuit arrangement as claimed in claim 1, wherein the counting direction of the first counter is reversible, the circuit arrangement including means for reversing the counting direction of the first counter so that it counts up from an initial count and upon reaching a maximum count is reversed and subsequently counts down.

3. A circuit arrangement as claimed in claim 2, further comprising a first gate circuit coupled to the count input of the first counter for suppressing the next pulse at said count input when the first counter has reached the maximum count.

4. A circuit arrangement as claimed in claim 3 wherein said maximum count is a fixed count of the first counter at which count the first counter is automatically reversed, and that said counter automatically stops upon reaching the initial count.

5. A circuit arrangement as claimed in claim 4 further comprising a second gate circuit for producing starting pulses in synchronism with the first clock signal and set pulses phase-shifted 180° relative to the starting pulses, the starting pulses each time start the first counter and the set pulses set the first counter to the maximum count at instants that the set pulses appear while the first counter still counts up.

6. A circuit arrangement as claimed in claim 5 wherein the sequential network comprises a bistable circuit coupled to the first counter and which is always changed over at the same count of the first counter so as to generate a carrier wave, a third gate circuit coupled to the first counter for the parallel generation of all the required modulation pulses which each have a width which is determined by the said signal waveform and which each extend in at least one direction from the count at which the bistable circuit is changed over, and a sequential modulator circuit which in a sequence which is determined by said signal waveform each time modulates the carrier wave with one of the modulation pulses.

7. A circuit arrangement as claimed in claim 6, wherein the sequential modulator circuit includes means for modulating the carrier wave both on the rising and the falling edges.

8. A circuit arrangement as claimed in claim 6 wherein said third gate circuit includes means for generating all the required modulation pulses symmetrically relative to that count of the first counter at which the bistable circuit is changed over.

9. A circuit arrangement as claimed in claim 8 wherein the count at which the bistable circuit changes over is the maximum count of the first counter.

10. A circuit arrangement as claimed in claim 8 wherein said signal waveform is a sine wave and the sequential modulator circuit comprises an n-counter having a counting input to which a counting signal is applied in synchronism with the first clock signal and providing an output signal whose frequency bears a ratio of n:1 to the frequency of the input signal, a six-counter having an input to which the output signal of the n-counter is applied, one counting cycle of the six-counter corresponding to one period of said sinewave, a fourth gate circuit responsive to a command from the n-counter to consecutively transfer all the modulation pulses required for the first 60° of the sinewave to an output as a first pulse train, a fifth gate circuit responsive to a command from the n-counter to consecutively transfer all the modulation pulses required for the second 60° of the sinewave to an output as a second pulse train, a sixth gate circuit responsive to a command from the n-counter to consecutively transfer all the modulation pulses required for the third 60° of the sinewave to an output as a third pulse train, the first, second and third pulse trains produced by the fourth, fifth and sixth gate circuits being repeated upon each counting step of the six-counter, a first modulator circuit which upon a first, second and third counting step of the six-counter in that order supplies the first, second and third pulse trains respectively and the carrier wave to a first modulation gate circuit which combines the carrier wave and the respective pulse train in accordance with an AND-function, and which upon a fourth, fifth and sixth counting step of the six-counter in that order supplies the first, second and third pulse trains respectively and the carrier wave to a second modulation gate circuit which combines the carrier wave and the inverse of the respective pulse train in accordance with an OR-function, and a first output gate circuit which combines the output signals of the first and the second modulation gate circuits in accordance with an OR-function.

11. A circuit arrangement as claimed in claim 10 for generating three pulse-width modulated signals which are 120°, phase-shifted relative to each other, wherein the circuit arrangement further comprises a second modulator circuit which upon the third, fourth and fifth counting step of the six-counter in that order supplies the first, second and third pulse train respectively and the carrier wave to a third modulation gate circuit which combines the carrier wave and the respective pulse train in accordance with an AND-function, and which upon the sixth, first and second counting step of the six counter in that order supplies the first, second and third pulse train respectively and the carrier wave to a fourth modulation gate circuit which combines the carrier wave and the inverse of the respective pulse train in accordance with an OR-function, a third modulator circuit which upon the fifth, sixth and first counting step of the six counter in that order supplies the first, second and third pulse train respectively and the carrier wave to a fifth modulation gate circuit which combines the carrier wave and the respective pulse train in accordance with an AND function, and which upon the second, third and fourth counting step of the six counter in that order supplies the first, second and third pulse train respectively and the carrier wave to a sixth modulation gate circuit which combines the carrier wave and the inverse of the respective pulse train in accordance with an OR-function, a second output gate circuit which combines the output signals of the third and fourth modulation gate circuits in accordance with an OR-function, and a third output gate circuit which combines the output signals of the fifth and sixth modulation gate circuits in accordance with an OR-function.

12. A circuit arrangement as claimed in claim 10 further comprising a circuit for generating starting pulses for the first counter in synchronism with the first clock signal, the ratio of the frequency of the first clock signal to the repetition frequency of the starting pulses being 1:a, first means for adjusting the factor a, a first adjustable divider connected between the input of the first counter and the input for the second clock signal, which first adjustable divider divides the second clock signal by a factor b, and a second means for adjusting the factor b in such a way that the ratio b/a is constant.

13. A circuit arrangement as claimed in claim 12 further comprising a second adjustable divider with a dividend m, from which divider an output signal is applied to the n-counter as a counting signal and which divider is included between the first input and the circuit for generating starting pulses for the first counter, the dividend being adjustable and the number of counting steps n of the n-counter being adjustable in such a way that the product nm is constant.

14. A circuit arrangement as claimed in claim 2 further comprising a third input for generating a third clock signal, a reference counter for counting the pulses of the third clock signal, a circuit for deriving a periodic signal for starting and stopping the reference counter from the first clock signal so that the counting time of the reference counter is determined by the frequency of the first counting signal with the reference counter being reset after each counting period, a gate circuit for reading out the count of the reference counter at the end of each counting period of the reference counter, the gate circuit detecting counts of the reference counter within specific adjoining ranges, a memory circuit for storing the range detected by the gate circuit, and means for controlling the gate circuit as a function of the information stored in the memory circuit in such a way that a specific range which is detected by the gate circuit in the case that the information stored in the memory circuit corresponds to said range at both sides overlaps the corresponding range for which the gate circuit is sensitive in the case that the information stored in the memory circuit does not correspond to said range.

15. A circuit arrangement as claimed in claim 2 which forms part of a control device for a three-phase motor, the circuit arrangement further comprising a direct voltage source for energizing the motor via a plurality of switches that are controlled by the modulated carrier wave generated by the sequential network, the first input being connected to a first clock signal generator and the second input to a second clock signal generator.

16. A device for generating a pulse width modulated carrier wave signal modulated in accordance with a preselected signal waveform comprising, first and second inputs for receiving first and second clock signals, respectively, a counter having a count input and a start input wherein the counter counts pulses appearing at said count input in response to periodic pulses present at the start input, first means coupling said first input to the counter start input so that a counting period is defined by the first clock signal, second means coupling said second input to the count input of the counter whereby the count is advanced in the counter by the second clock signal, a sequential network coupled to the counter so that in a sequence of time intervals the sequential network responds to a predetermined count of the counter in each said time interval so as to reverse its logic state for each said predetermined count, and third means coupling said first input to the sequential network so as to synchronize said time intervals with the counting periods, the sequential network being responsive to a sequence of counts which are determined by said preselected signal waveform so as to generate at the output of the sequential network pulses having relative pulse widths determined by said signal waveform.

17. A device as claimed in claim 16 wherein the counter comprises a reversible counter with means for reversing the counting direction when the counter reaches a predetermined count, said device further comprising a first gate circuit coupled between said second input and the count input of the counter and logic means for controlling said first gate circuit so that it suppresses the passage of the next pulse appearing at the second input after the counter reaches said predetermined count.

18. A device as claimed in claim 17 further comprising a second gate circuit coupled between said first input and the start input of the counter for deriving start pulses for the counter synchronized to the first clock signal.

19. A device as claimed in claim 16 wherein the sequential network comprises a bistable circuit coupled to the counter output and logic means for controlling the bistable circuit so that it is triggered each time the counter achieves said predetermined count thereby to generate a carrier wave signal, a gate circuit coupled to the counter output including means for generating modulation pulses of different widths determined by said preselected signal waveform and centered on said predetermined count of the counter, and a sequential modulator circuit responsive to said carrier wave signal and said modulation pulses for deriving said pulse width modulated carrier signal.

20. A device as claimed in claim 19 wherein the sequential modulator circuit includes means for modulating both the rising and falling edges of the carrier wave signal.

21. A device as claimed in claim 19 wherein said gate circuit generating means is arranged to generate modulation pulses that occur symmetrically relative to said predetermined count of the counter.

* * * * *